(12) United States Patent
Mahmoodi et al.

(10) Patent No.: US 12,271,217 B2
(45) Date of Patent: Apr. 8, 2025

(54) CURRENT REFERENCE CIRCUIT WITH PROCESS, VOLTAGE, AND WIDE-RANGE TEMPERATURE COMPENSATION

(71) Applicant: SanDisk Technologies LLC, Addison, TX (US)

(72) Inventors: Mohammad Reza Mahmoodi, Goleta, CA (US); Martin Lueker-Boden, Fremont, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 162 days.

(21) Appl. No.: 17/903,464

(22) Filed: Sep. 6, 2022

(65) Prior Publication Data

US 2024/0077902 A1  Mar. 7, 2024

(51) Int. Cl.
 *G05F 3/24* (2006.01)
 *G11C 5/14* (2006.01)
(52) U.S. Cl.
 CPC .............. *G05F 3/245* (2013.01); *G05F 3/247* (2013.01); *G11C 5/147* (2013.01)
(58) Field of Classification Search
 CPC ................................. G05F 3/245; G05F 3/247
 See application file for complete search history.

(56) References Cited

U.S. PATENT DOCUMENTS

| | | | |
|---|---|---|---|
| 6,356,161 B1 * | 3/2002 | Nolan | H03K 3/011 331/74 |
| 7,675,792 B2 | 3/2010 | Bedeschi | |
| 7,728,575 B1 * | 6/2010 | Ozalevli | G05F 3/30 327/513 |
| 8,358,119 B2 | 1/2013 | Kim | |

(Continued)

FOREIGN PATENT DOCUMENTS

| | | | |
|---|---|---|---|
| CN | 102788949 A | * 11/2012 | ............... G01K 3/10 |
| CN | 105468085 B | * 6/2017 | ............. G05F 3/262 |

(Continued)

OTHER PUBLICATIONS

Yang et al., "A 36 ppm/° C. BiCMOS Current Reference Without Requiring Curvature-Compensation," Analog Integrated Circuits and Signal Processing, 80, pp. 99-104, Apr. 19, 2014 (https://doi.org/10.1007/s10470-014-0302-4).

*Primary Examiner* — Sisay G Tiku
(74) *Attorney, Agent, or Firm* — Sheppard, Mullin, Richter & Hampton LLP

(57) ABSTRACT

Systems and methods are provided for generating a stable reference current that has low sensitivity to operating temperature and supply voltage variations and is stable across process corners. In an example implementation, an improved reference current generator circuit is provided that includes a first circuit generating a first current that is proportional to absolute temperature and a second circuit generating a second current that is complementary to absolute temperature based on first transistors operating in respective triode regions. The second current compensates for process, voltage, and temperature variations in the first current at a node. According to some examples, the second current is also generated based on second transistors operating in respective saturation regions. The first current may be generated using a forward biased PN junction diode.

16 Claims, 22 Drawing Sheets

(56) References Cited

U.S. PATENT DOCUMENTS

| | | | |
|---|---|---|---|
| 9,436,206 B2 | 9/2016 | Liu | |
| 2007/0252573 A1* | 11/2007 | Tachibana | G05F 3/30 |
| | | | 323/313 |
| 2010/0148857 A1* | 6/2010 | Chellappa | G05F 3/242 |
| | | | 327/538 |
| 2020/0073430 A1* | 3/2020 | Panja | G05F 3/267 |
| 2020/0195245 A1* | 6/2020 | Randolph | H03K 17/163 |
| 2020/0195246 A1* | 6/2020 | Randolph | H03K 17/04123 |
| 2020/0218302 A1* | 7/2020 | Brule | G05F 3/30 |
| 2021/0286394 A1 | 9/2021 | Radwan | |
| 2024/0077903 A1* | 3/2024 | Mahmoodi | G05F 3/267 |

FOREIGN PATENT DOCUMENTS

| | | | | | |
|---|---|---|---|---|---|
| CN | 107992158 A | * | 5/2018 | | G05F 3/26 |
| CN | 110928353 B | * | 6/2021 | | G05F 1/567 |
| CN | 117908624 A | * | 4/2024 | | |
| CN | 118192741 A | * | 6/2024 | | |
| KR | 20040065326 A | | 7/2004 | | |

\* cited by examiner

CURRENT REFERENCE CIRCUIT WITH PROCESS, VOLTAGE, AND WIDE-RANGE TEMPERATURE COMPENSATION

DESCRIPTION OF RELATED ART

Current reference circuits are used to generate stable reference currents, which are minimally affected by process variation, voltage fluctuation, or temperature drift (PVT). Current reference circuits may be used as building blocks for integrated circuit (IC) design, such as analog, digital and mixed-signal circuits where precision current is needed. Because of their critical role in microelectronics, different techniques, technologies and circuit configurations have been applied to achieve such precision voltage.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

The figures are not exhaustive and do not limit the present disclosure to the precise form disclosed.

DETAILED DESCRIPTION

Reference current generators are widely used in IC design to generate stable reference currents. The increasing development of largescale IC necessitates the need for accurate and stable current references. Furthermore, accurate and precise current references directly impact computation accuracy of ICs, which may translate to an impact in the performance of the overall system in which an IC is included. For example, in the case of Double Data Rate 5 (DDR5) memory design, an increase in precision and stability of a reference current, in all PVT cases, translates to increased power savings in the circuitry (e.g., transmitter and receiver circuitry) because the circuits need not be overdesigned to ensure they are able to function in all PVT cases. That is, to ensure such circuits function properly across a range of PVT conditions. Thus, it is preferentially to provide high precision references with low sensitivity to temperature, process, and supply voltage (PVT) variations.

A low temperature coefficient (TC) and high precision current reference is one of the most significant aspects in many IC applications. The reference current must be stable and accurate across fabrication processes, supply voltages and temperature variations, particularly over a designed for range of supply voltages and temperature range for all "process corners." Manufacturing processes in the semiconductor industry are subject to stochastic errors, causing a real process to differ from an ideal or target process. In particular, real processes distribute according to a Gaussian pattern around a target process. A key parameter used to characterize manufacturing processes is the switching speed of the resulting electrical components/devices, based on which a given process can be classified according to so called "process corners" (e.g. "fast", "slow" or "typical" process corners).

For example, some prior current reference generators are unable to provide the required stability and accuracy. FIGS. 1A-2E depict graphical simulation results of reference currents, with respect to PVT variations, generated by an existing reference current generator.

Figure 1A:
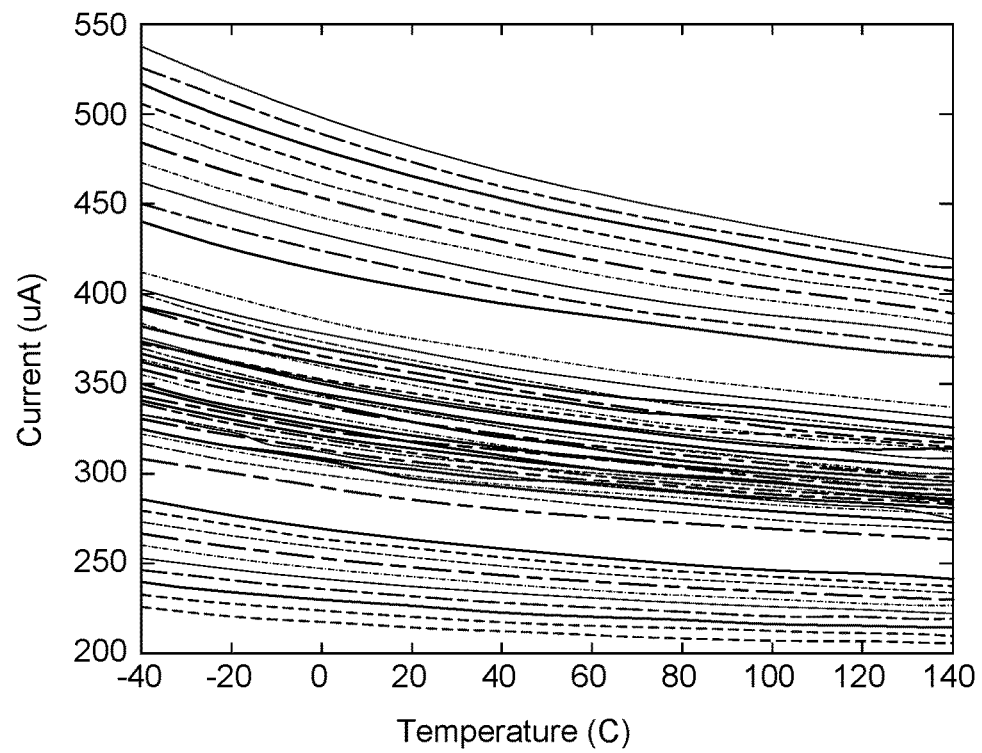
FIGS. 1A-1E depict graphical simulation results of reference currents, with respect to temperature, generated by an existing reference current generator.
Figure 1B:
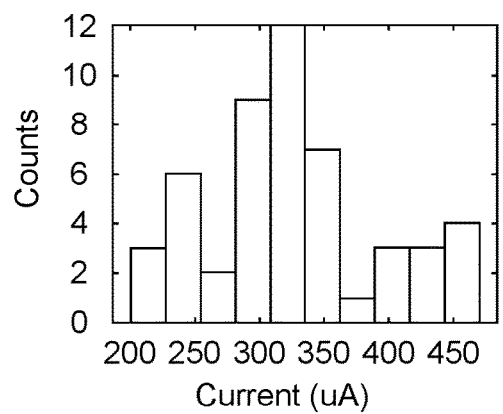
Figure 1C:
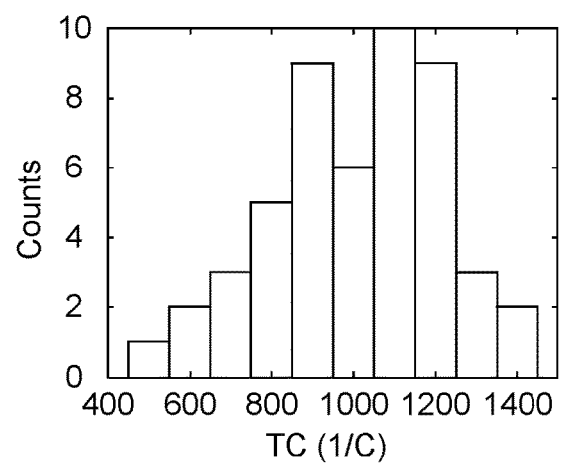

FIG. 1A depicts reference current results plotted as a function of temperature for numerous process corners over a range of supply voltages from 1.067 V to 1.16 V at increments of 0.01 V. Each line shown in FIG. 1A corresponds to a single process corner and a supply voltage increment, thus there are multiple lines for each process corner as the supply voltage is incremented. FIGS. 1B and 1C are histograms of the simulation results of FIG. 1A and illustrating counts as a function of reference current (FIG.

Figure 1D:
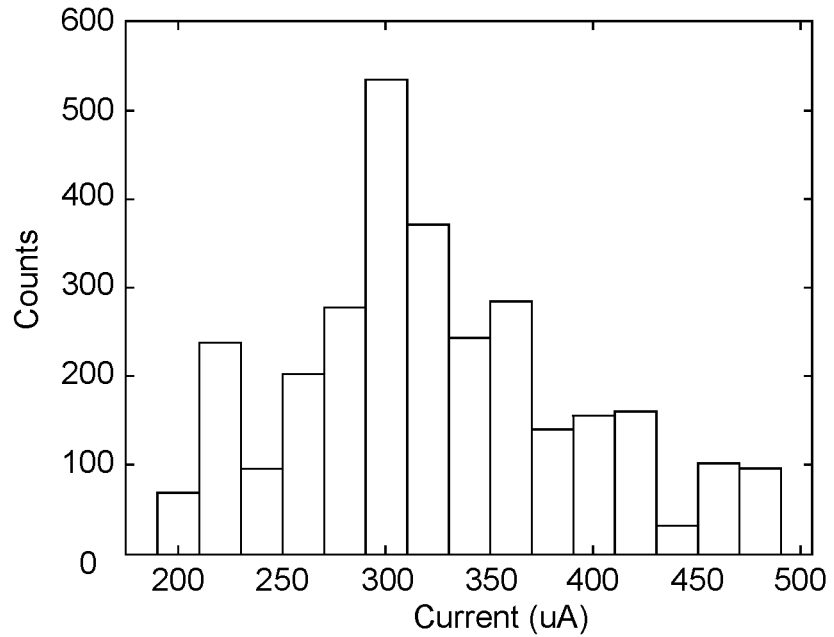
Figure 1E:
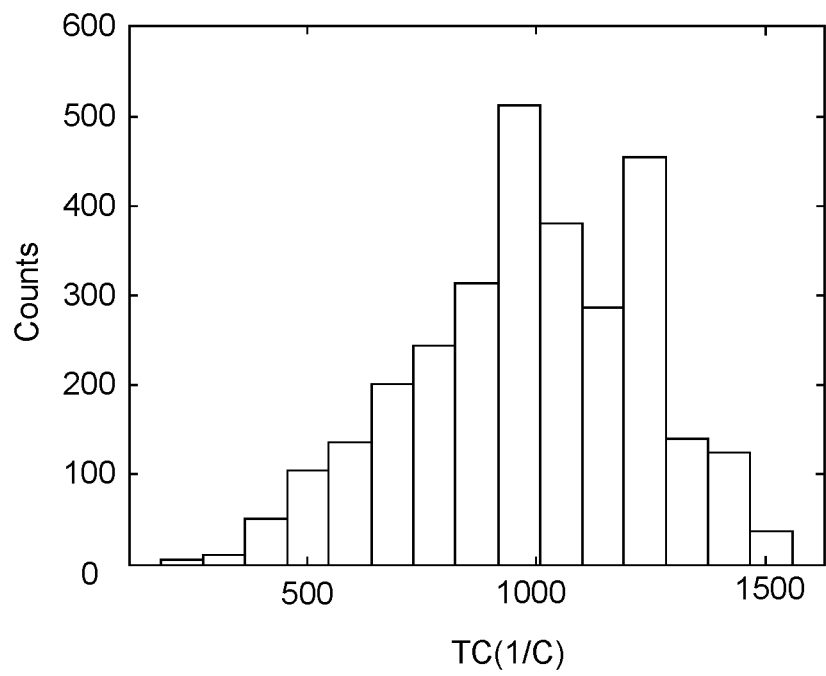

1B) and TC (FIG. 1C). FIGS. 1D and 1E are histograms of 100 Monte Carlo simulations performed across all process corners and illustrating counts as a function of reference current (FIG. 1D) and TC (FIG. 1E). As shown in FIGS. 1A-1E, the current reference changes significantly between temperatures of −40° C. to 140° C. From the graphical results, the mean value (μ) of the reference current is 325 μA and the standard deviation (σ) is 66.46 μA, which translates to a standard deviation over the mean value of approximately 20% which. Furthermore, the current reference circuit corresponding to FIGS. 1A-1E has a maximum TC of 1548 ppm/° C., which is very large and not ideal. TC is determined by, for a given corner and supply voltage, taking the difference between the maximum current ($I_{max}$) and the minimum current ($I_{min}$), dividing the difference by the average current ($I_{avg}$), and then multiple the result by one over the temperature range (e.g., ΔT or 180° C. in this example). Thus, TC is (($I_{max}-I_{min}$)/$I_{avg}$)×(100/ΔT), and then multiplying by 100 and dividing by 1 million to provide parts per million.

Figure 2A:
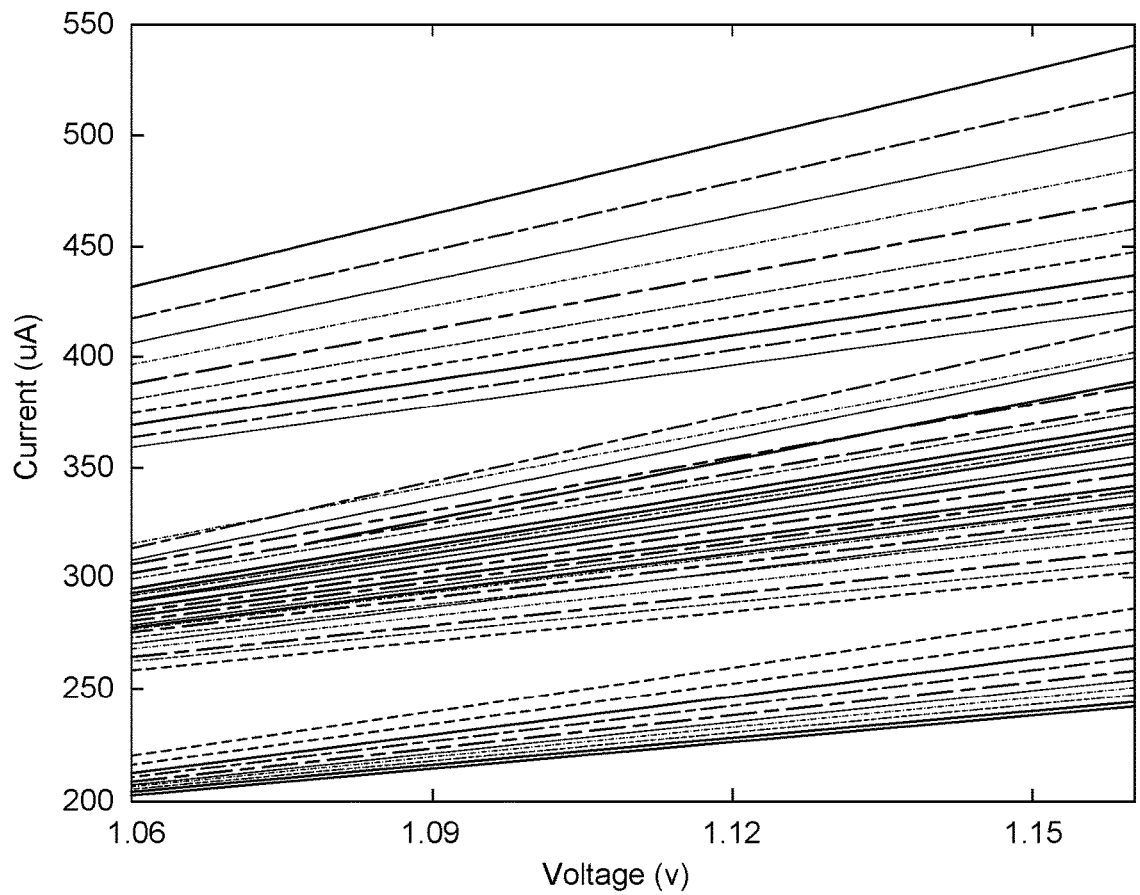
FIGS. 2A-2E depict graphical simulation results of reference currents, with respect to supply voltage, generated by an existing reference current generator.
Figure 2B:
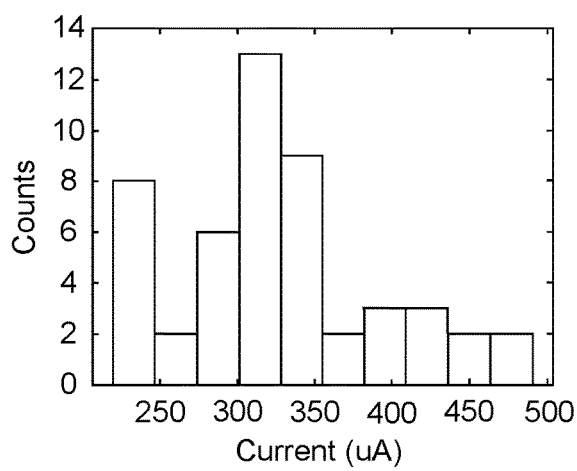
Figure 2C:
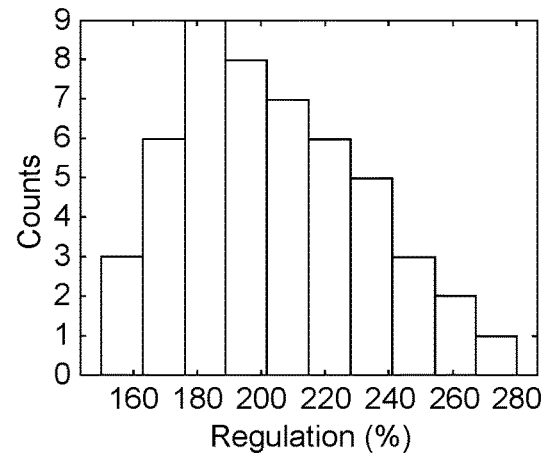
Figure 2D:
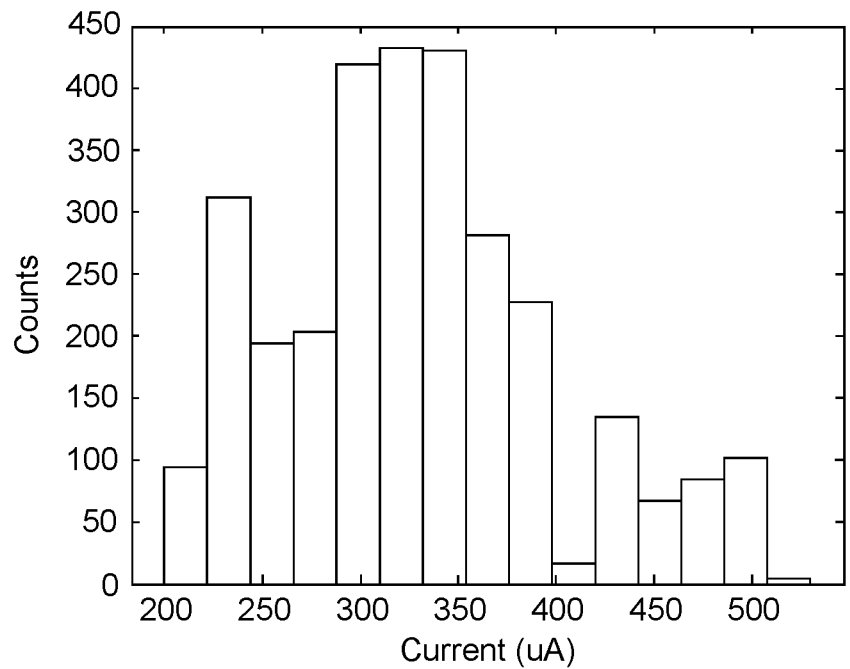
Figure 2E:
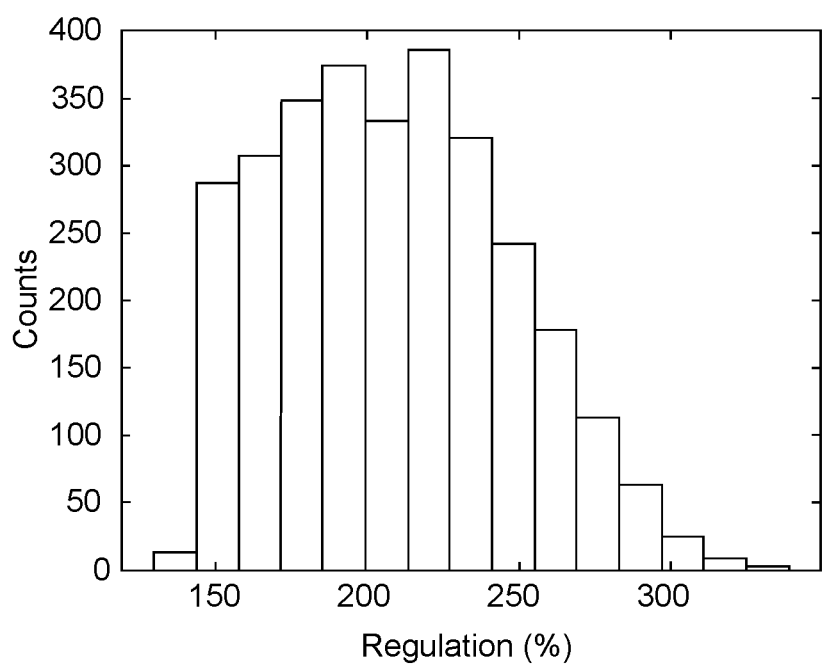

FIG. 2A depicts reference current results plotted as a function of supply voltage for numerous process corners over a range of temperature incremented from −40° C. to 140° C. at increments of 20° C. Each line shown in FIG. 2A corresponds to a single process corner and a temperature increment. FIGS. 2B and 2C are histograms of the simulation results of FIG. 2A and illustrating counts as a function of reference current (FIG. 2B) and regulation (FIG. 2C). Regulation is determined by, for a given corner and supply voltage, taking the difference between $I_{max}$ and $I_{min}$, dividing the difference by $I_{avg}$, multiplying the result by 100 over the voltage range (e.g., ΔV or 0.1V in this example). Thus, regulation is (($I_{max}-I_{min}$)/$I_{avg}$)×(100/ΔV). FIGS. 2D and 2E are histograms of 100 Monte Carlo simulations performed across all process corners and illustrating counts as a function of reference current (FIG. 2D) and regulation (FIG. 2E). As shown in FIGS. 2A-2E, the current reference changes significantly as the supply voltage changes. From the graphical results, the mean value (μ) of the reference current is 329 μA and the standard deviation (σ) is 69 μA, which translates to a standard deviation over the mean value of approximately 21% which. Furthermore, the current reference circuit corresponding to FIGS. 2A-2E has a maximum regulation of 337%/V, which is not ideal.

The existing reference current generator used to generate FIGS. 1A-2E suffer from various technical problems, particularly with respect to maintaining stable reference current (also referred to herein as constant width temperature or CWT reference current) across process induced variations and temperature changes. That is, the existing approach is unable to provide a precise circuit because of the fluctuations in the current due to PVT variations. Furthermore, power consumption by an IC becomes a consideration when designing an IC that utilizes the existing current reference circuit to provide the reference current. For example, as shown in FIGS. 1A and 2A, the maximum power consumption by the existing circuit is over 500 μA and the minimum is 200 μA, with a mean value between 325-329 μA. As a result, the IC needs to be designed can have to up to 2.5 times valuation in the power budget. Typically, ICs are designed and assessed for the worst-case scenario, e.g., the highest amount of power consumption, which means that the design has to consider the maximum power consumption (e.g., 500 μA) in the power budget. Thus, when designing for 300 μA of power consumption, the circuit must be designed to account for the worst-case scenario of up to 500 μA. The power consumption "grade" of the conventional circuits is obtained based on the 500 μA worst-case, which is >1.6× larger than the target 300 μA. This is waste of budget because worst-case variations are high.

Some conventional reference current generators have been used in industry to address the above shortcomings and generate a stable reference current. The conventional approaches are generally implemented by summing up carefully designed complementary to absolute temperature (CTAT) and proportional to absolute temperature (PTAT) current references, which attempts to cancel out PVT variations that act on the CTAT and PTAT. In one example, some conventional approaches utilize a voltage drop on a resistor produced by base-emitter voltage ($V_{BE}$) of parasitic bipolar junction transistors (BJTs) and a threshold voltage ($V_{th}$) of metal-on-semiconductor (MOS) field-effect transistors (MOSFETs). This concept and other similar implementations have been improved by reusing cascode transistors and utilizing a digital trimming circuit to compensate for PVT variations. Another example of a conventional approach is implemented by dividing a carefully designed PTAT voltage, from a $V_{th}$ of MOSFETs, over a PTAT resistor. Furthermore, complicated trimming techniques (e.g., based on nonvolatile memories) have been proposed to enhance the TC and variations at the expense of additional IC fabrication costs, power consumption, and increased chip real estate. Several nano-ampere range references have also been proposed for energy-harvesting systems, which operate at very low voltages and deep weak inversion regimes. However, these non-ampere range designs often underperform at high temperatures and require inevitable calibration to reduce variations and the temperature coefficient.

Accordingly, embodiments of the disclosed technology provide an improved current reference generator, corresponding circuit implementation, and method thereof that achieves improved stability for an increased range of PVT variations as compared to the conventional approaches. More particularly, and as will be described in more detail below in this disclosure, embodiments disclosed comprise a current generator stage that includes at least two MOSFETS operating in triode region that function to generate a CTAT current and a MOSFET connected so as to function as forward bias PN junction diode that generates a PTAT current. Using two MOSFETS operating in triode region to generate a CTAT current can reduce physical area requirements of the circuit and reduce in power consumption due to using two such transistors. Similarly, by using a MOSFET connected so to function as a forward bias PN junction diode can reduce area requirements and power consumption, and process variations are reduced because the device acts as a diode rather than a transistor. In some embodiments where the circuit is not an integrated design, a forward bias PN junction diode may be used in place of the MOSFET. The PTAT current and CTAT current are summed together, thereby cancelling out temperature variations. This enables the embodiments disclosed herein to achieve stability in terms of temperature variations over an increased range of temperatures as compared to the conventional circuits, thereby providing a technical improvement over the existing design.

Additionally, the embodiments disclosed herein are capable of generating a current reference that has increased stability with respect to supply voltage (e.g., reduced regulation). More particularly, some embodiments disclosed herein utilize a voltage regulator stage to suppress variations in the supply voltage. For example, some embodiments of reference current generators disclosed herein comprise a current generator stage and a voltage regulator stage connected between a supply voltage and the current generator stage. The voltage regulator stage operates to generate a stable voltage reference with respect to at least variations in the supply voltage. The stable voltage reference is provided to the current generator stage, which generates the PTAT and CTAT currents, as described above, based on the stable voltage reference. By suppressing voltage variations prior to the current generator stage through the voltage regulator stage, the embodiments disclosed herein achieve improved stability in terms of supply voltage variations as compared to the conventional circuits, thereby providing a technical improvement over the existing design.

Furthermore, embodiments disclosed herein provide further compensation of process induced variations by utilizing process-dependent injection device. For example, one or more transistors that exhibit process induced variations (e.g., process-dependent) are connected to the current reference generator. The transistors may, for example, have a threshold voltage that increases from a slow-slow (SS) process corner to a fast-fast (FF) process corner. Thus, the injection devices function to sink a negligible amount of current from the circuit for SS process corners, while sinking larger amounts of current for the FF process corners. The amount of current sunk at the FF process corner serves to reduce the current generated by the circuit for FF process corners and reduce the spread of the current across all process corners (e.g., reduce the standard deviation). By reducing the standard deviation in generated currents across all process corners, the embodiments disclosed herein achieve improved stability in terms of process induced variations, thereby providing a technical improvement over the existing design.

Accordingly, embodiments disclosed herein function to generate an output reference current that is stable over a range of temperatures, for a range of supply voltages, across a plurality of process corners. For example, embodiments disclosed herein generate a reference current that is insensitive, as compared to existing and conventional approaches, to temperature variations between −40 and 140° C., supply voltage variations between 97% and 106% of the supply voltage, across all process corners.

For example, the range of temperatures may be representative of ambient an environmental temperatures that the reference current generator 300 is exposed to throughout operation. Over such a range (for example, −40° C. to 140° C.), the embodiments disclosed herein outputs a reference current that exhibits minimal variations, as compared to a maximum TC of 1548 ppm/° C. of the existing approach and as shown in Table 1 below that provides a comparison of the embodiments disclosed herein against some comparative examples of conventional approaches. That is, within the temperature range, the reference current varies only within an acceptable current levels. For example, FIG. 9A, below, provides an illustrative example of reference current as a function of temperature according to embodiments disclosed herein.

Similarly, the embodiments disclosed herein may be exposed to fluctuations in supply voltage. For example, the supply voltage may fluctuation from 106% to 97% of the designed for supply voltage due to circuity external to the embodiments disclosed herein sinking or sourcing current from the supply. As such, the embodiments disclosed herein are configured to generate an output current that is insensitive to these fluctuations, as compared to a maximum regulation of 337%/V of the existing approach and as shown in Table 1 below. For example, FIG. 9B, below, provides an illustrative example of reference current as a function of supply voltage according to embodiments disclosed herein.

While the embodiments disclosed herein may be designed for a certain supply voltage, embodiments herein may operate on less than the designed for supply voltage. For example, the embodiments disclosed herein may be designed for nominal supply voltage of 1.1V (thus insensitive for supply voltages between 1 and 1.3V), but nonetheless be able to function from a supply voltage of 0.65V or more.

Figure 9A:
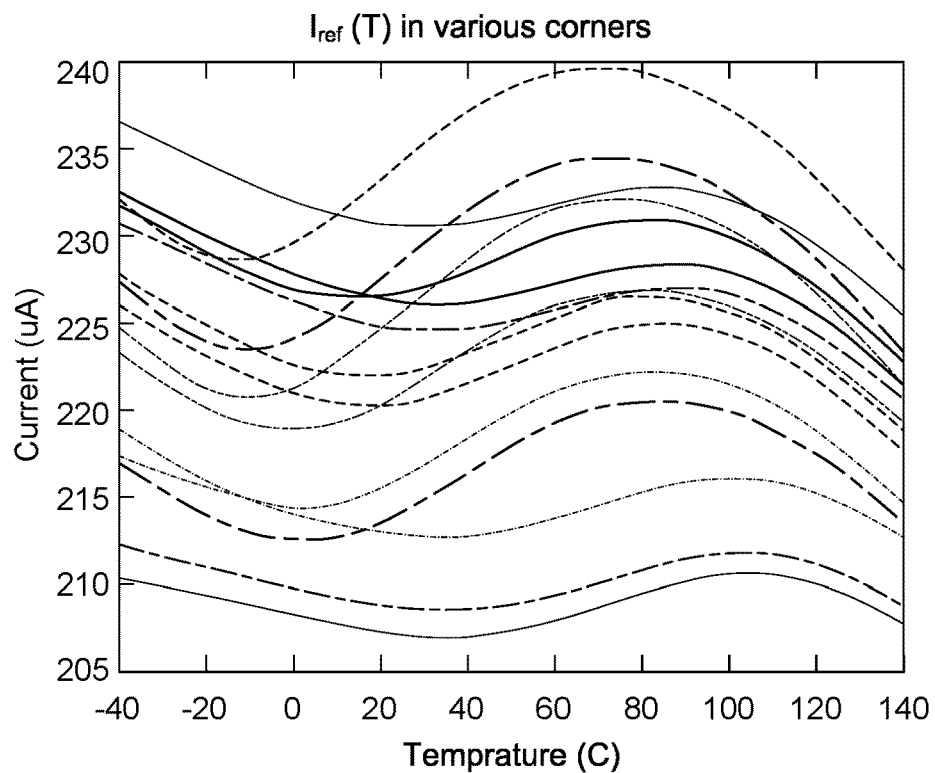
FIGS. 9A and 9B are examples plots illustrating stability, with respect to PVT variations, of current generated by the current generator stage of FIG. 8A.
Figure 9B:
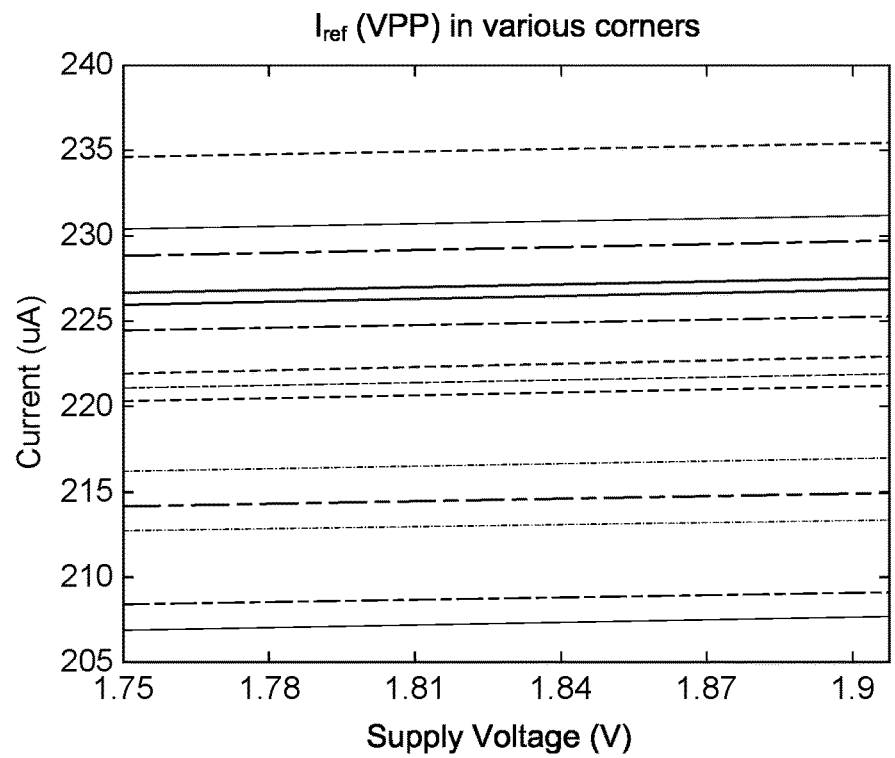

Furthermore, process induced variations in the electrical components that make up the embodiments disclosed herein may provide for variations in electrical properties between physical implementations of the embodiments disclosed herein. For example, variations in physical properties of electrical components due manufacturing tolerances (e.g., semiconductor doping levels and concentrations, device sizes, etc.) may translate to differences between each real world physical implementation of the embodiments disclosed herein. For example, dopant concentration of transistors may fluctuate within manufacturing tolerances that may translate to differences in threshold voltages, which can impact the operation of the embodiments disclosed herein. As alluded to above, process induced variations are characterized as a plurality of process corners for each electrical component, for example, a fast (F), slow (S), and typical (T) corner. Each device has its own corners, and when the components are combined into a single circuit the number of corners increases to cover all variations. For example, an n-channel MOSFET (nMOS) transistor may have F, S, and T corners and a p-channel MOSFET (pMOS) may also have a F, S, and T corners. Across both nMOS and pMOS there would be FF, FS, FT, SF, ST, SS, TT, TS, and TF corners. In the embodiments disclosed herein, there may be 15 process induced corners, and the embodiments disclosed herein function to generate an output voltage that is stable across all 15 process corners, for example, as shown in FIGS. 9A and 9B.

Figure 3:
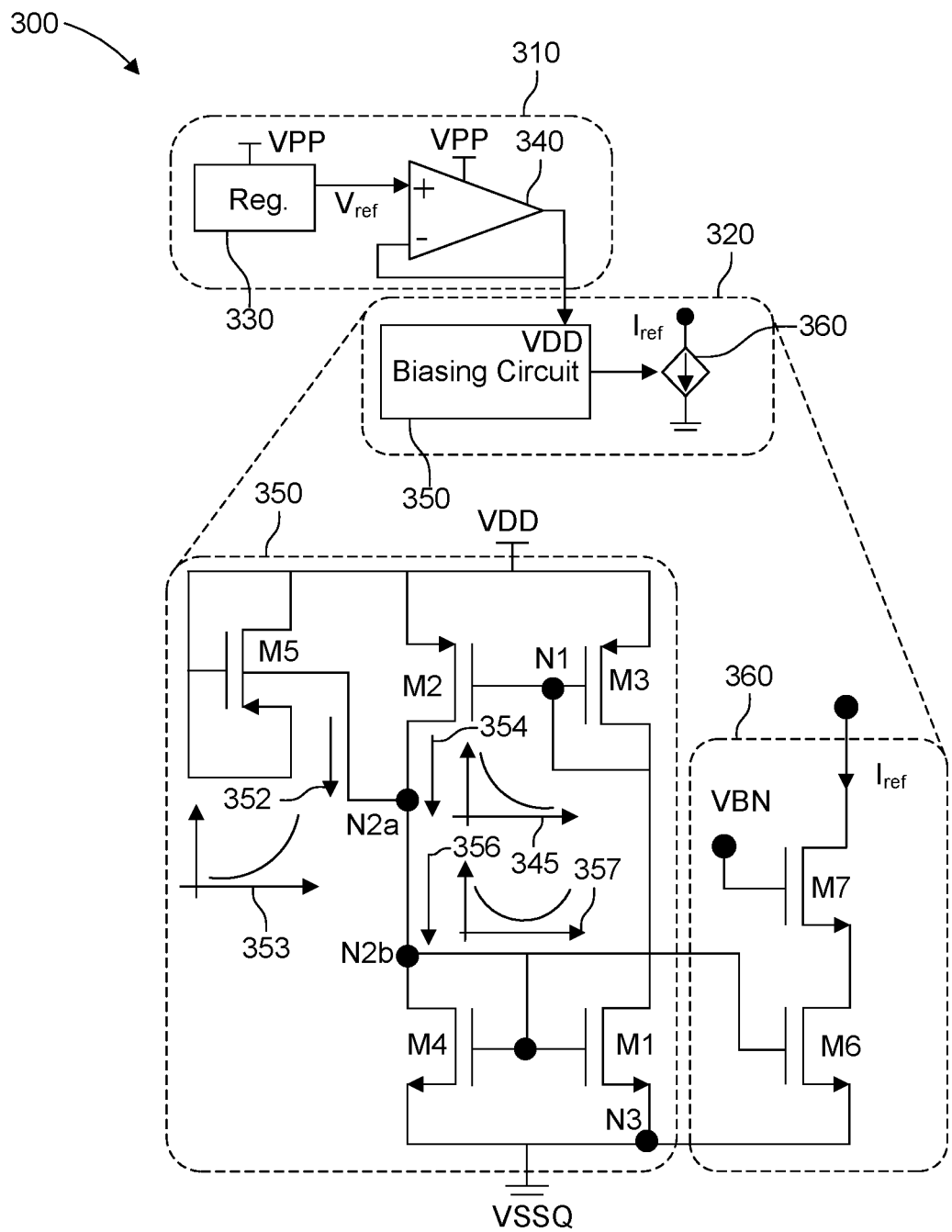
FIG. 3 depicts an example circuit implementation of a reference current generator according to embodiments of the disclosed technology.

FIG. 3 depicts an example circuit implementation of a reference current generator 300 according to embodiments of the disclosed technology. The reference current generator 300 functions to generate an output reference current $I_{ref}$ that is stable over a range of temperatures, for a range of supply voltages, across a plurality of process corners. For example, reference current generator 300 functions to generate a reference current $I_{ref}$ that is relatively insensitive to temperature variations between −40 and 140° C., supply voltage variations between 97% and 106% of the supply voltage, across all process corners. The reference current generator 300 generates the reference current with PVT compensation. That is, reference current generator 300 functions to reduce TC, line sensitivity, and variations. For example, the reference current generator 300 generates a Continuous Wavelet Transform (CWT) current using one or more transistors operating in triode region to provide a CTAT current and cancel temperature variations using a transistor based diode. A reference voltage generator 330 assists by reducing voltage sensitivity, for example, using injection devices and transistors to reduce the spread of variations, as will be described below in greater detail.

The reference current generator 300 includes a voltage regulator stage 310 and a current generator stage 320. The voltage regulator stage 310 comprises a reference voltage generator 330 configured to generate a reference voltage $V_{ref}$ based on a supply voltage VPP and the reference voltage $V_{ref}$ is provided to a positive terminal of an operational amplifier 340. The output terminal of the operational amplifier 340 is connected to the current generator stage 320 and to the negative terminal of the operational amplifier 340. As used herein, the term "connected to" may refer to directly connected to or indirectly connected through one or more intervening components. Similarly, "coupled to" or "coupled with" may refer to direct or indirect coupling. The operational amplifier 340 buffers the voltage $V_{ref}$ from the reference voltage generator 330 and outputs voltage VDD to the current generator stage 320. For example, the operational amplifier 340 ensures that its output voltage closely tracks its input voltage without the output circuitry (e.g., current generator stage 320) loading (e.g., negatively impacting) the input circuit (e.g., voltage regulator stage 310). Based on the voltage VDD, the current generator stage 320 produces a reference current $I_{ref}$ that is stable to PVT variations.

The reference voltage generator 330 may comprise any circuit topology capable of producing an output voltage that is stable to PVT variations. The voltage output from the reference voltage generator 330 must be stable over at least the same range of PVT variations as the current generator stage 320. That is, according to example implementations disclosed herein, the voltage generated by reference voltage generator 330 and voltage regulator stage 310 should be insensitive to temperature variations between −40 and 140° C. and supply voltage variations between 97% and 106% of the supply voltage, across all process corner. Certain example circuit implementations for the reference voltage generator 330 are provided herein, for example, with reference to FIG. 5. These examples are for illustrative purposes only, and other circuit implementations are possible. For example, a complementary MOS transistor based reference voltage generator design is provided in U.S. application Ser. No. 17/903,306 filed on Sep. 6, 2022 titled "LOW LINE-SENSITIVITY AND PROCESS-PORTABLE REFERENCE VOLTAGE GENERATOR CIRCUIT", the disclosure of which is incorporated herein by reference in its entirety, which may be used as the reference voltage generator 330 according to some embodiments.

The current generator stage 320 includes reference current generator 350 (also referred to herein as a bias circuit), implemented as the circuit shown in FIG. 3, configured to generate a stable current. The current generator stage 320 also includes output circuit 360 configured to copy the stable current generated from reference current generator 350 and output the current as reference current $I_{ref}$. The current generator stage 320 comprises a plurality of metal-oxide-semiconductor (MOS) field-effect transistors (MOSFETs) that make up reference current generator 350 and output circuit 360. For example, reference current generator 350 comprises transistors M2, M3, and M5, which may be p-channel MOSFET (pMOS transistors) or another suitable semiconductor device. Reference current generator 350 also comprises transistors M1 and M4, which may be n-channel MOSFET (nMOS transistors) or another suitable semiconductor device. Output circuit 360 comprises transistors M6 and M7, which may be transistors) or another suitable semiconductor device. Reference to a transistor as nMOS or pMOS is not intended to be limiting, and is used herein for illustrative purposes only as an example implementation. For example, the polarity of the doping (e.g., n-channel or p-channel) may be reversed and the current generator stage 320 implemented with M2, M4, and M5 as nMOS transistors and M4, M6, M7, and M1 as pMOS transistors.

In the example implementation of FIG. 3, a voltage VDD, from the voltage regulator stage 310, is connected to drain, source, and gate terminals of transistor M5 and connected to source terminals of transistors M2 and M3. Gate terminals of transistors M2 and M3 are connected as node N1, which is connected to the drain terminal of transistor M1. Drain terminal of transistor M2 is connected to the body of transistor M5 via node N2 (shown as node N2a and N2b), which is connected to the drain terminal of transistor M4. The gate terminals of transistors M4 and M1 are also connected to the body of transistor M5 and drain terminal of pMOS transistor M2 via node N2b. Source terminals of transistors M4 and M1 are connected to a VSS or ground at node N3. A gate terminal of transistor M6 is connected to node N2, while its source terminal is connected to node N3 and its drain terminal is connected to the source terminal of transistor M7 (referred to herein as cascode transistor M7). The gate terminal of cascode transistor M7 is connected to a bias voltage VBN and the reference current $I_{ref}$ is output from its drain terminal. Bodies of pMOS transistors are connected to VDD and bodies of nMOS transistors are connected to VSS unless otherwise stated herein (e.g., transistor M5 having a body connected to node N2a).

To provide a stable current $I_{ref}$ at node N3, the reference current generator 350 generates a first reference current 353 from body of transistor M5 (arrow 352) and a complementary second reference current 354 from drain terminal of transistor M2 (arrow 354). The first and second reference currents 353 and 355 combine at node N2a to provide a current 357 at node N2b (arrow 356). The current at node N2b, due to combining the first and second references which are exposed to the same PVT variations, is stable to the variations, as will be explained below. An example flowchart of a method for generating a stable reference current is provided below in connection with FIG. 8B, which may be executed by circuit 350.

For example, reference current generator 350 generates a CTAT current as the second reference current 355 at arrow 354. Transistors M2 and M3 and transistors M1 and M4 operate to generate the CTAT current. Transistor M2 and transistor M1 operate in triode region based on sizing the transistors properly, such that the gate to source voltage ($V_{GS}$) is above the threshold voltage ($V_{th}$) of the respective transistor and that the drain to source voltage ($V_{DS}$) is less than $V_{GS}$ minus $V_{th}$. Transistor M3 and transistor M4 operate in saturation region, for example, by driving their respective $V_{GS}$ above their respective $V_{th}$ and driving their respective $V_{DS}$ at greater than or equal to $V_{GS}$ minus $V_{th}$. For example, the voltage at the gate terminals of M2 and M3 are the same due to being connected to the same node and the voltage applied to their respective source terminals is the same (e.g., VDD). Thus, properly sizing the respective transistors provides for different operating regions. As a result, the current across node N2a from the transistor M2 is complementary to temperature variations, e.g., a CTAT current. Complementary refers to the aspect that the current changes in a direction that is reverse to the direction of the temperature change (e.g., as temperature increases the current decreases, and vice versa).

Additionally, reference current generator 350 generates a PTAT current as the first reference current 353 at arrow 352. For example, transistor M5, which functions as a forward bias PN junction diode (also referred to herein PN diode M5) due to its body being connected to source terminal of transistor M2 and gate terminal of transistor M4, operates to generate the PTAT current. In some embodiments where the circuit is not an integrated design, a forward bias PN junction diode may be used in place of the transistor M5. As a result of the forward bias applied by the PN diode M5, the current generated at the body of the PN diode M5 will be proportional to temperature, that is the current at arrow 352 will change in proportion and in the same direction as the change in temperature.

At node N2a, the PTAT current and CTAT current are summed together. As a result temperature dependencies in the PTAT and CTAT currents will be cancelled out due to inverse relationships therebetween. As a result, current 357 is provided that is stable with relatively respect to temperature at node N2b.

This current at node N2b is then copied to the output circuit 360 based on transistor M6, through current mirroring techniques. For example, transistor M4 produces current 357 at its drain terminal based on its gate-to-source voltage ($V_{GS}$). Because gate terminals of transistor M4 and M1 are connected to the gate terminal of M6 and their source terminals are connected, the current at the drain terminal of transistor M6 is approximately equal to the drain current of transistor M4 times the ratio of the width of transistor M6 to the width of transistor M4. To minimize the process variations, the length of transistors M1, M4, and M6 may be the same.

Cascode transistor M7 functions to increase output resistance of at the drain terminal of cascode transistor M7 and ensure the voltage between the cascode transistor M7 and the transistor M6 does not change significantly. For example, the higher the output resistance, the less change in the current when the output voltage changes. Thus, the current depends on the application and the requirements of the circuit implementation that will be loaded by the reference current source. By maintaining a constant voltage at the node between transistors M7 and M6, temperature response of the output current can be improved and ensure that the current does not change with a change in voltage at this node.

Due to transistors M1 and M2 operating in the triode region, M2 may be prone to variations in a voltage supplied to the current generator stage 320. To address this susceptibility, the voltage regulator stage 310, which may be a low-current voltage regulator circuit, may be added between the voltage supply and the current generator stage 320. The voltage regulator stage 310 generates a voltage VDD that is stable to PVT variations The stable voltage VDD is then input into the current generator stage 320 such that any variations in the supply voltage VPP will be diminished by the voltage regulator stage 310. As a result, to the extent that the current generator stage 320 (e.g., reference current generator 350) has any dependency on the input voltage, such dependency is mitigated through operation of the voltage regulator stage 310.

Figure 4:
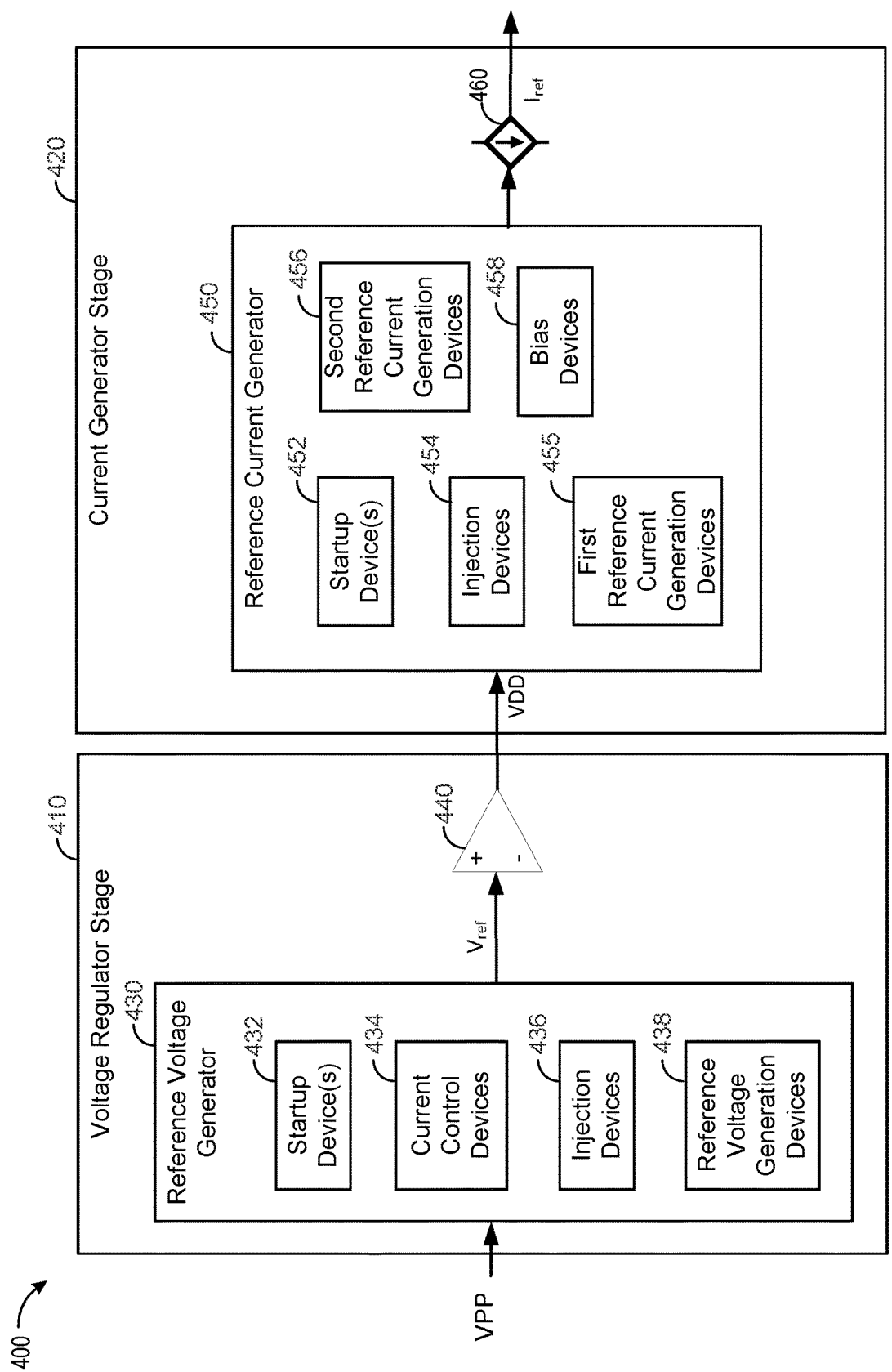
FIG. 4 is a block diagram of another example reference current generator according to embodiments of the disclosed technology.

FIG. 4 is a block diagram of another example reference current generator 400 (also referred to herein as a reference current generator circuit) for generating a stable reference current that is insensitive to a range of PVT variations according to embodiments of the disclosed technology. The reference current generator 400 is configured to generate an output reference current $I_{ref}$ that is stable over a range of temperatures, for a range of supply voltages, across a plurality of process corners. For example, embodiments provide an output voltage that is insensitive to temperature variations between −40 and 140° C., supply voltage variations between 97% and 106% of the supply voltage, across all process corners.

The reference current generator 400 according to embodiments disclosed herein includes a voltage regulator stage 410 and a current generator stage 420. According to some embodiments, the voltage regulator stage 310 of FIG. 3 is an example circuit implementation of the voltage regulator stage 410 and the current generator stage 320 of FIG. 3 is an example circuit implementation if the current generator stage 420. Thus, the description above in connection with FIG. 3 may apply to the voltage regulator stage 410 and current generator stage 420.

In an example implementation, the voltage regulator stage 410 (also referred to herein as a voltage regulator circuit) comprises a reference voltage generator 430 and an operational amplifier 440. The reference voltage generator 430 (also referred to herein as a reference voltage generator circuit) is configured to produce an output voltage $V_{ref}$ that is stable to PVT variations and the operational amplifier 440 is configured to buffer the voltage $V_{ref}$ from the reference voltage generator 430 and outputs voltage VDD to the current generator stage 420. The voltage $V_{ref}$ output from the reference voltage generator 430 must be stable over at least the same range of PVT variations as the current generator stage 420. The reference voltage generator 330 and operational amplifier 340 of FIG. 3 are example circuit implementations of the reference voltage generator 430 and operational amplifier 440, respectively. The reference voltage generator 430 may be implemented as a bandgap voltage reference circuit that utilizes bipolar junction transistors (BJTs) and/or a voltage reference circuit that utilizes CMOS transistors, so long as the output voltage $V_{ref}$ is stable to PVT variations. An example circuit implementation of bandgap voltage reference circuit is described below in connection with FIG. 5, which is provided as an example. Other implementations are possible as alluded to above in connection with FIG. 3.

The reference voltage generator 430 may comprise startup device(s) 432 (also referred to herein as a startup circuit), current control device(s) 434, and reference voltage generation devices 438. The startup device(s) 432 may include one or more electrical components configured to remove degenerate points of the current within the reference voltage generator 430, as well as reduce startup time by decreasing time period of the reference voltage generator 430 to settle responsive to ramping up supply voltage VPP. For example, the startup device(s) 432 may be coupled to the current control devices 434 and reference voltage generation devices 438 at a node. The startup device(s) 432 are configured to be activated responsive to receiving the supply voltage VPP and operate to charge the node to a non-zero current (e.g., non-degenerate point). Once charged (e.g., the output voltage $V_{ref}$ stabilizes), the startup device(s) 432 is deactivated and draws minimal to zero current.

Without the startup device(s) 432, there are at least two points that current in the reference voltage generator 430 may stabilize such that the reference voltage generator 430 will operate as designed. Once such point is when all electrical components of the reference voltage generation devices 438 have the same current, and the second where there is zero current passing in reference voltage generation devices 438. However, if the reference voltage generation devices 438 have zero current, then the reference voltage generator 430 would not output any voltage. This point of zero current is referred to herein as the degenerate point. Thus, the startup device(s) 432 function to force the current in the reference voltage generation devices 438 to the optimum point having non-zero current to ensure proper operation after the settling period.

The current control devices 434 (also referred to herein as a current control circuit) may include a plurality of electrical components, which are configured to feed current into the reference voltage generation devices 438. The current control devices 434 are configured to mirror the current at different nodes coupled to reference voltage generation devices 438 so that voltage levels at each node can be properly maintained.

The reference voltage generation devices 438 (also referred to herein as a reference voltage generation circuit) includes a plurality of electrical components configured to generate the stable DC output voltage $V_{ref}$. In some embodiments, the reference voltage generation devices 438 comprise one or more BJTs that are driven based on the current from the current control devices 434 to generate a stable current. In other embodiments, the reference voltage generation devices 438 comprise other transistors, such as CMOS transistors, that are driven based on the current from the current control devices 434 to generate a stable current.

According to some embodiments, the reference voltage generator 430 may comprise injection devices 436 (also referred to as process-dependent injection devices), which are configured to generate a process-dependent current that shifts an output voltage $V_{ref}$ for fast process corners toward the typical and slow process corners. Shifting the output voltage $V_{ref}$ in this way, improves changes in the output current $I_{ref}$ due to process induced variations, for example, by reducing a standard deviation in output voltage $V_{ref}$ due to process induced variations.

Figure 5A:
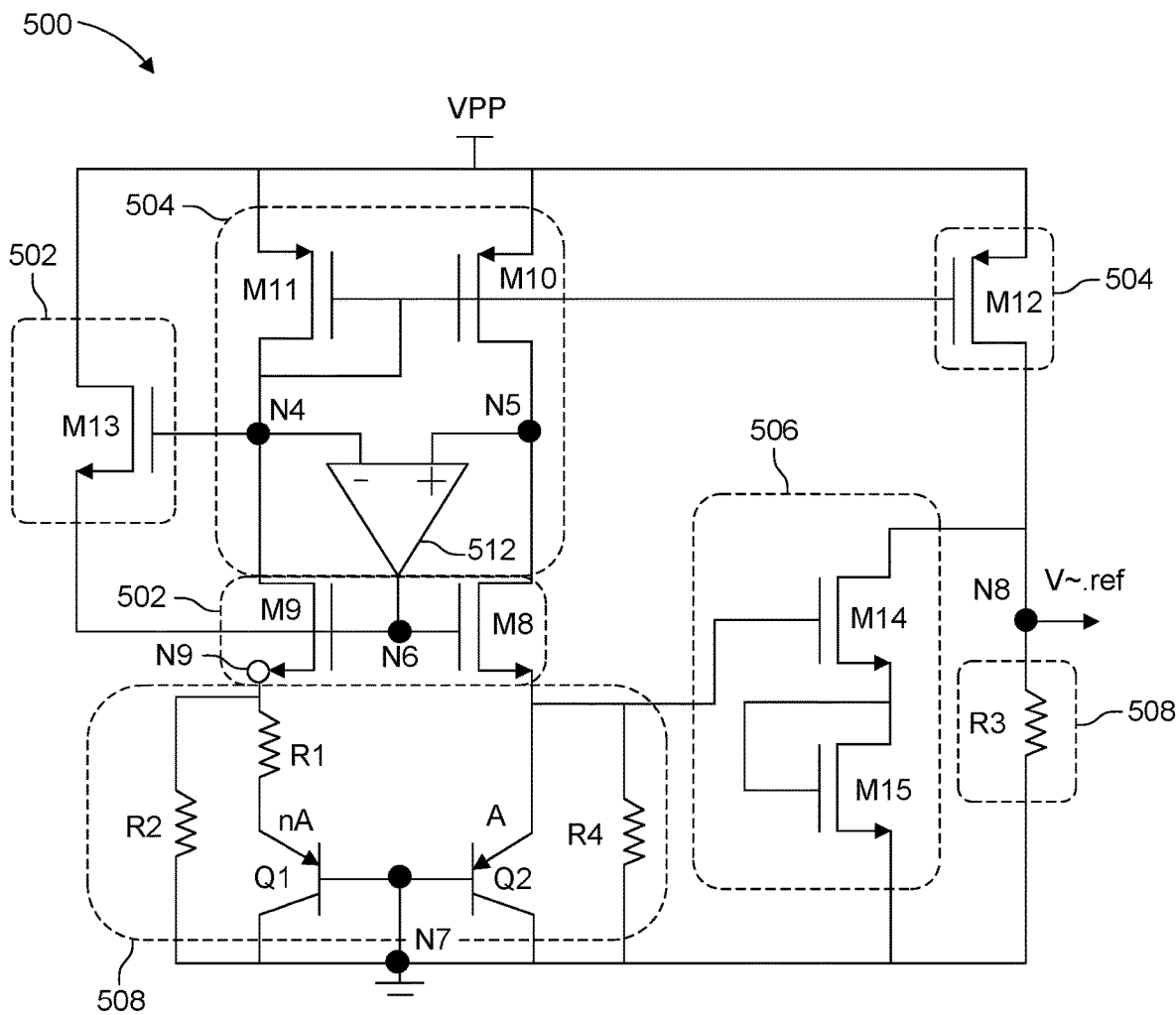
FIG. 5A depicts an example circuit implementation of a voltage regulator stage included as part of the reference current generator of FIG. 4 according to embodiments of the disclosed technology.
Figure 5B:
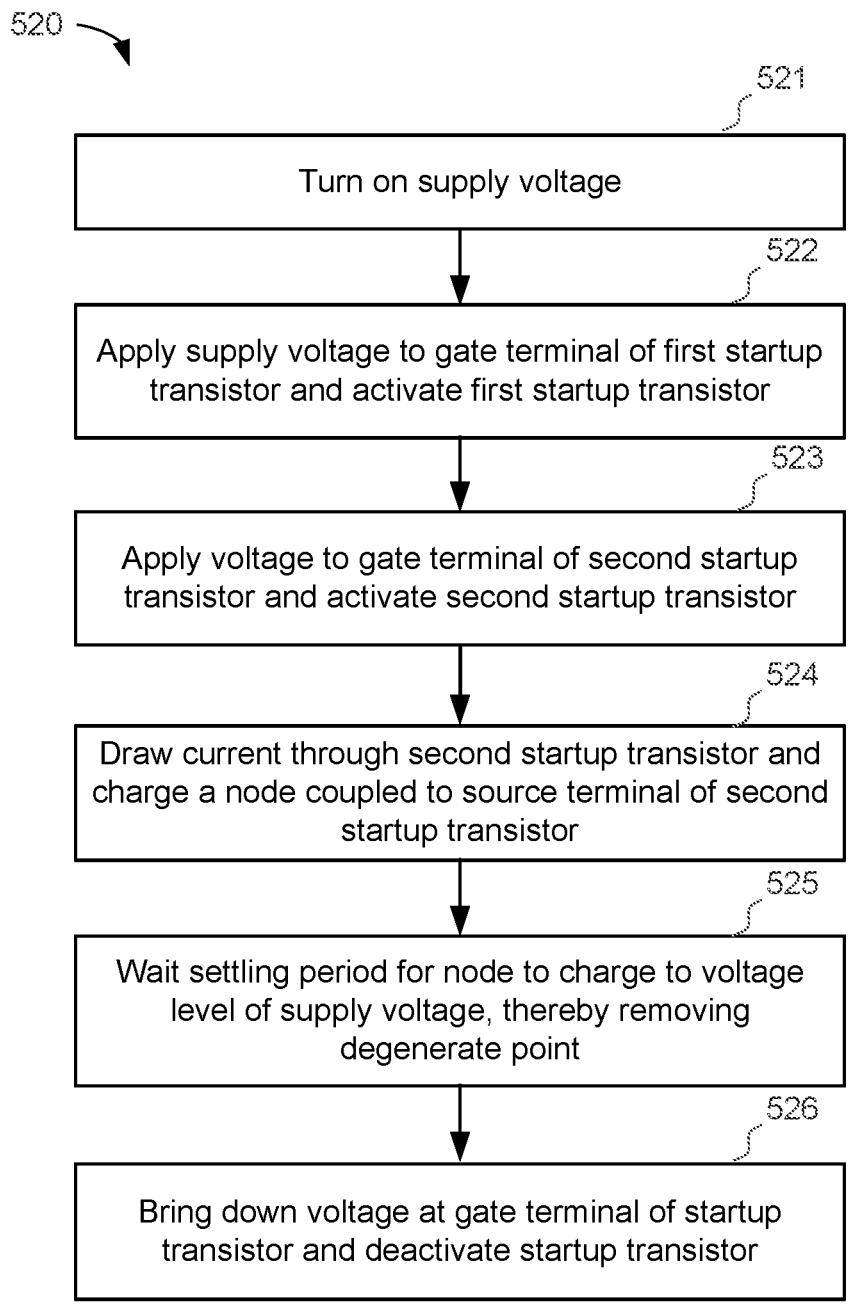
FIG. 5B is a flowchart depicting an example method of operation of the circuit of FIG. 5A according to embodiments of the disclosed technology.

FIG. 5A depicts an example circuit implementation 500 of the reference voltage generator 430 according to embodiments of the disclosed technology. FIG. 5B is a flowchart depicting an example method 520 of operation of the circuit 500 according to embodiments of the disclosed technology. The method 520 will be described hereinafter in the context of the example circuit implementation 500.

The circuit 500 includes startup devices 502, current control devices 504, injection devices 506, and reference voltage generation devices 508. The circuit 500 comprises a plurality of MOSFETs that are included as part of startup devices 502, current control devices 504, injection devices 506, and reference voltage generation devices 508.

The current control devices 504 may be example circuitry for implementing current control devices 434 of FIG. 4 and includes operational amplifier 512 and transistors M10, M11, and M12, which may be p-channel MOSFET (pMOS transistors) or another suitable semiconductor device. As shown in FIG. 5, source terminals of transistors M10, M11, and M12 are connected to supply voltage VPP and each gate terminal is coupled to a negative input terminal of the operational amplifier 512 at node N4. The drain terminal of transistor M10 is connected to a positive terminal of operational amplifier 512 at node N5. The output terminal of the operational amplifier 512 is connected to reference voltage generation devices 508 at node N6 and nodes N4 and N5 are connected to drain terminals of transistors M9 and M8, respectively. As described above with reference to FIG. 3, the current control devices 504 function to ensure the current at node N4 is mirrored at node N5 such that the current into transistors the current at the source terminal of transistor M8 is mirrored at the drain terminal of transistor M5.

The startup devices 502 may be example circuitry for implementing startup devices 432 of FIG. 4 and includes transistors M13, M9, and M8, which may be a n-channel MOSFET (nMOS transistors) or another suitable semiconductor device. As shown in FIG. 5, a drain terminal of transistor M13 is connected to the supply voltage VPP and its gate terminal is connected to the negative terminal of the operational amplifier 512 via node N4. Source terminal of transistor M13 is connected to the output terminal of the operational amplifier 512 via node N6. Source terminals of transistors M9 and M8 are connected to the negative and positive terminals of the operational amplifier 512 via nodes N4 and N5, respectively. The source terminals of transistors M2 and M1 are connected to respective and reference voltage generation devices 508. As described above with reference to FIG. 4, the startup devices 502 function to remove the degenerate point by charging the node N6 upon startup or reset (e.g., when the supply voltage is activated), thereby driving transistors M8 and M9 to operate in their respective saturation regions and charging node N9.

Referring to FIG. 5B, method 520 depicts a flowchart for removing a degenerate point of the circuit 500, via the startup devices 502, according to embodiments of the disclosed technology. Prior to turning on the supply voltage VPP, the current in the circuit 500 is zero and the voltage at node N4 and N6 is zero. Responsive to the supply voltage being turned on, at block 521, the supply voltage VPP is applied to the gate terminal of transistor M13 (also referred to herein as first startup transistor). For example, the negative input terminal of the operational amplifier 512 is connected to the gate of transistors M13 and M11, and, when the drain current of transistor M11 is zero, the gate-to-source voltage of transistor M11 should be zero, which means its gate terminal should be at VPP. As the voltage applied to the gate terminal of transistor M13, at block 522, ramps up from low voltage level VSS or GND to the supply voltage level VPP, the gate-to-source bias voltage ($V_{GS}$) (e.g., voltage at the gate terminal is VPP and voltage at the source terminal is zero) of transistor M13 is brought up in excess of the threshold voltage of transistor M13, which turns transistor M13 ON (e.g., activated). Responsive to turning transistor M13 ON at block 522, transistor M13 draws current through its drain terminal, which charges node N6 and applies a voltage to the gate of transistors M9. As the voltage applied to the gate terminal of transistor M9 ramps up, the $V_{GS}$ of transistor M9 is brought up in excess of the threshold voltage of transistor M9, which turns transistor M9 ON (e.g., activated), at block 523. Once transistor M9 is turned on, M9 draws current through its drain terminal to charge the node N9 to the supply voltage level VPP at block 524. Once node N9 is charged (e.g., after a settling period during which the node N6 is charged), the voltage at node N9 goes up forcing the current at node N9 to a non-zero current, thereby removing the degenerate point (e.g., zero current as explained above in connection with FIG. 4) at block 525. Furthermore, due to current mirroring, the current at the source terminal of transistor M8 is also forced to a non-zero current. Also, during a settling period, the voltage at the gate terminal of transistor M13 (e.g., at node N4) is brought down, by virtue of the output terminal of the operational amplifier 512. Also, due to the local negative feedback imposed by the operational amplifier 512, the voltage on node N5 tracks with that of node N4. At the end of the settling period, the operational amplifier 512 has enforced the voltage at nodes N4 and N5 to be approximately equal.

For example, assuming that the circuit 500 falls into a degenerate point during supply voltage ramp up, node N4 remains close to supply voltage VPP and node N6 remains close to ground, and the drain current of transistors M10 and M11 become close to zero. In such case, $V_{GS}$ of transistor M13 and drain-to-source voltage ($V_{DS}$) of transistor M13 become large and transistor M13 conducts current from its supply terminal to node N6, which dumps charge on to node N6. In such case, the voltage at node N6 is elevated to reach a non-zero current value and node N4 decreases until $V_{GS}$ of transistor M13 become less than its threshold voltage, thereby turning transistor M13 OFF. At this point, the circuit 500 has settled in a non-zero current (e.g., non-degenerate point) and transistor M13 no longer conducts current.

After the settling period, the voltage at the gate terminal of transistor M11 is less than the supply voltage level VPP, and may be almost zero. The gate terminal of transistor M13 is also brought down at block 526, which causes the $V_{GS}$ of transistor M13 to be reduced well below its threshold voltage, thereby turning transistor M13 OFF (e.g., deactivated). As such, after the settling period, negligible current flows through transistor M13. As a result, the circuit 500 operates to generate a PVT insensitive output voltage, as described below. Additionally, the voltage at node N6 (e.g., the gate terminal of transistor M9) is brought down to level that is sufficiently high to keep transistors M9 and M8 to remain active.

The reference voltage generation devices 508 may be example circuitry for implementing reference voltage generation devices 438 of FIG. 4 and includes resistors R1-R4 and transistors Q1 and Q2, which may be BJT transistors or other suitable semiconductor device. In the example shown in FIG. 5, transistors Q1 and Q2 are provided as PNP BJTs; however, NP BJTS may be implemented instead and the circuit 500 updated accordingly. In the example of FIG. 5, first terminals of resistors R1 and R2 are connected to the source terminal of transistor M9, a second terminal of resistor R1 is connected to the emitter of BJT Q1, and second terminal of resistor R2 is connected to the collector of BJT Q1. An emitter of BJT Q2 is connected to the source terminal of transistor M1, and bases of BJT Q1 and BJTQ2 are connected to ground at node N7. The emitter of BJT Q1 is connected to a first terminal of resistor R4 and its collector is connected to the second terminal of resistor R4. Additionally, the collectors of BJTs Q1 and Q2 are connected to ground, which is connected a first terminal of resistor R3. Drain terminal of transistor M5 is coupled to a second terminal of second resistor R3 at node N8, from which a reference voltage $V_{ref}$ is generated. As described above with reference to FIG. 4, the reference voltage generation devices 508 are provided to control the output voltage at node N8. That is, the reference voltage generation devices 508 are provided and current applied thereto that generates an output voltage $V_{ref}$ that is stable to PVT variations, as will be described below in connection with FIGS. 6A-7C.

The injection devices 506 may be example circuitry for implementing reference injection devices 436 of FIG. 4 and includes transistors M14 and M15, which may be nMOS transistors or another suitable semiconductor devices. The gate terminal of transistor M14 is connected to the source terminal of BJT Q2 and the first terminal of resistor R4. The drain terminal of transistor M14 is connected to the second terminal of resistor R3 at node N8 and its source terminal is connected to the gate and drain terminals of resistor M15. The source terminal of transistor M15 is connected to ground. As described above with reference to FIG. 4, the injection devices 506 are provided to generate a process-dependent current that shifts an output voltage $V_{ref}$ for fast process corners toward the typical and slow process corners. For example, transistors M14 and M15 may be process-dependent transistors that function to sink current from node N8, where the amount of sunk current is dependent on the process corner. For example, at SS process corners, where the threshold voltage of transistors M14 and M15 become relatively large (e.g., relative to the fast-fast corner), the current sunk through these transistors becomes negligible, almost zero. Whereas, at FF process corners, where the threshold voltage is relatively small, the current sunk through these transistors becomes much larger. That is, at SS process corners the injection devices 506 pull negligible current from node N8 and the voltage $V_{ref}$ is negligibly impacted, whereas at FF process corners the injection devices 506 pull current from node N8 that shifts the voltage $V_{ref}$ down toward $V_{ref}$ of the SS corner. As a result, the amount of process induced variations in the voltage $V_{ref}$ and the standard deviation in voltage $V_{ref}$ are reduced.

In operation, after the settling period has passed and transistor M13 is turned off, the voltage and current at node N4 and node N5 will be the same due to operational amplifier 512 and transistors M11 and M10. As a result, the voltage level generated at node N8 (e.g., at the second terminal of the resistor R3) will be the current $I_8$ (e.g., the current at node N8) times the resistance $r_2$ of resistor R2. Thus, the output voltage $V_{ref}$ is provided as follows (assuming the resistance of R2 is equal to the resistance of R4):

$$V_{ref} = \frac{r_3}{r_2}\left(|V_{EB2}| + \frac{r_2}{r_1}V_T \ln(n)\right) + r_3 I_{14} \quad \text{Eq. 1}$$

Where $V_{EB2}$ is the emitter-to-base voltage of Q2; $r_1, r_2, r_3,$ and $r_4$ are the resistance of resistors $R_1, R_2, R_3,$ and $R_4,$ respectively; $V_T$ is the thermal voltage; n is the ration of the emitter area of Q2 to Q1; and $I_{14}$ is the current sunk across transistor M14. The resistance of R2 and R4 may be similar, and may be equal. The current $I_{14}$ is negligible and provided only for process compensation, as noted above. Thus, Eq. 1 can be simplified to:

$$V_{ref} \sim \frac{R_3}{R_2}\left(|V_{EB2}| + \frac{R_2}{R_1}V_T \ln(n)\right) \quad \text{Eq. 2}$$

To achieve a TC of zero, the partial derivative of $V_{ref}$ with respect to temperature (T) is forced to zero as follows:

$$\frac{\partial V_{BG}}{\partial T} = 0 \quad \text{Eq. 3}$$

From Eqs. 2 and 3, $$\frac{R_2}{R_1}\ln(n) \sim 17.2,$$

which represents the value that is obtained from zero TC condition and the resistance $r_3$ of resistor R3 is selected based on the desired output voltage $V_{ref}$. That is, resistor R3 is selected so to produce a desired voltage level at the output.

Figure 6A:
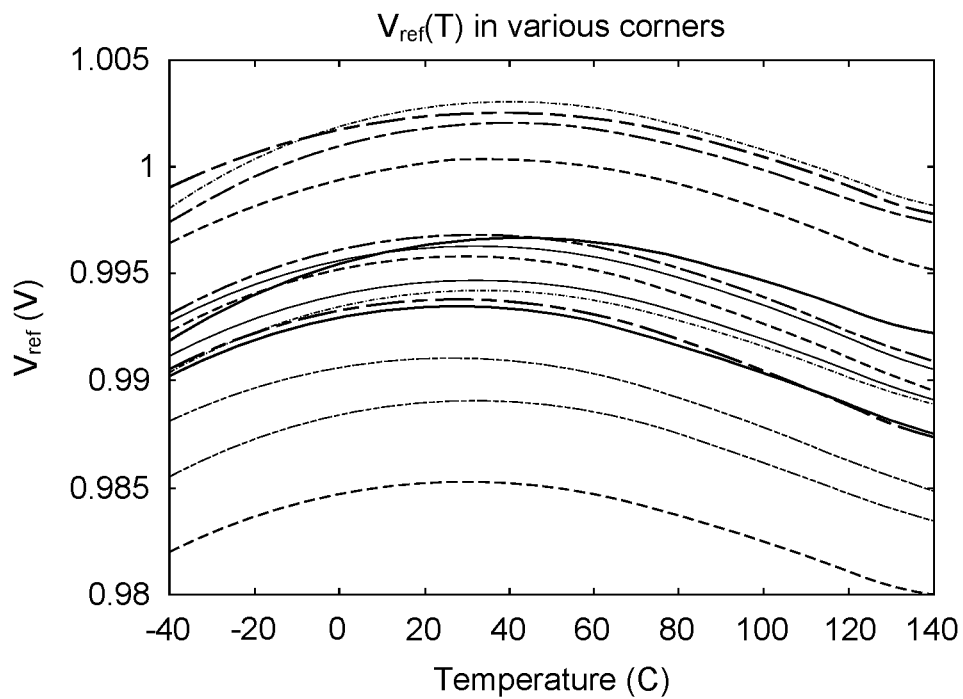
FIGS. 6A and 6B are examples plots illustrating stability, with respect to PVT variations, of voltage generated by the voltage regulator stage of FIG. 5.
Figure 6B:
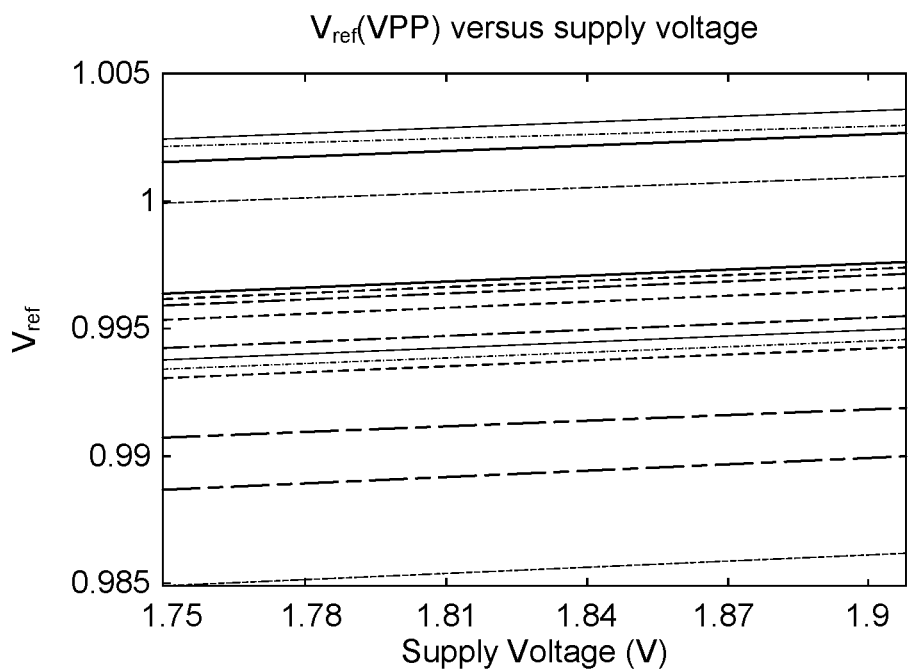

FIGS. 6A and 6B are examples plots illustrating stability, with respect to PVT variations, of output voltage $V_{ref}$ according to embodiments of the disclosed technology. Each plotted line of FIGS. 6A and 6B corresponds to an individual process corner (e.g., 15 corners in these examples), with FIG. 6A illustrating the voltage $V_{ref}$ generated by the circuit 500 plotted as a function of temperature and FIG. 6B illustrating the voltage $V_{ref}$ generated by the circuit 500 plotted as a function of supply voltage.

As shown in FIG. 6A, for each process corner, the output voltage $V_{ref}$ with respect to temperature is substantially constant. For example, with reference to FIG. 6A, the mean output voltage across all corners is 0.994 V, with a standard deviation of 5 millivolts and a temperature coefficient of less than 36 ppm/° C. Thus, subject to process variations, the TC of the embodiments disclosed herein changes minimally (e.g., 36 ppm/° C. or less).

Similarly, FIG. 6B shows that the output voltage $V_{ref}$ with respect to the supply voltage is relatively constant. For example, with reference to FIG. 6B, the mean output voltage across all corners is 0.995 V, with a standard deviation of 5 millivolts and a regulation of less than 0.83%/V (e.g., how the output voltage changes with respect to supply voltage). Thus, subject to process variations, the embodiments disclosed herein exhibit good regulation within a given process variation.

Figure 7A:
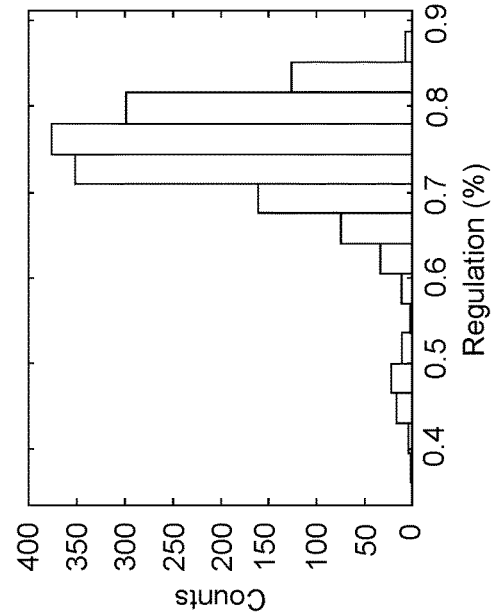
FIGS. 7A-7C are histograms of Monte Carlo simulations of the voltage regulator stage of FIG. 5.
Figure 7C:
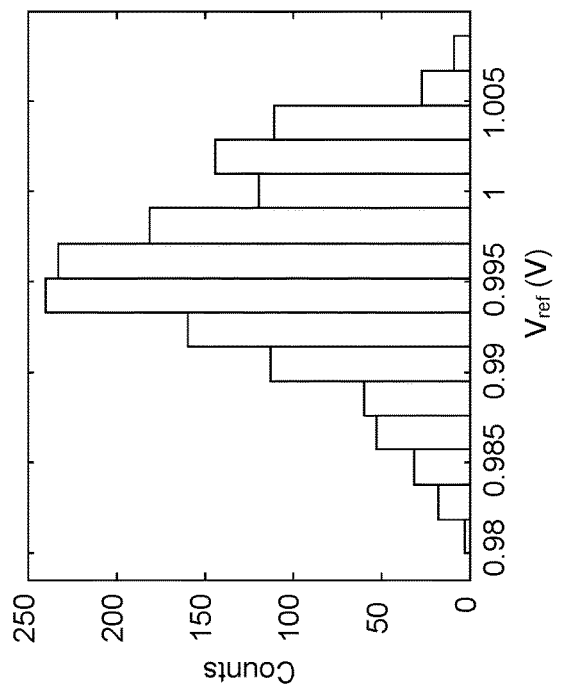
Figure 7B:
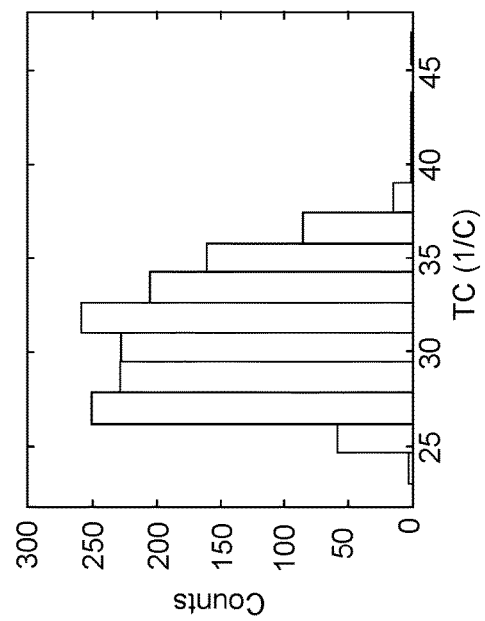

FIGS. 7A-7C are histograms of Monte Carlo simulations of the circuit 500 across all corners. To generate FIGS. 7A-7C, 100 Monte Carlo simulations were performed across all 15 process corners, thereby providing 15,000 simulation points. FIG. 7A illustrates counts of the Monte Carlo simulations as a function of output voltage $V_{ref}$, where the mean voltage is 0.994V with a standard deviation of 5 millivolts. FIG. 7B illustrates counts of the Monte Carlo simulations as a function of temperature coefficient (TC), where the mean TC is 31 ppm/° C. with a standard deviation of 3.2 ppm/° C. and a maximum TC of 46.2 ppm/° C. FIG. 7C illustrates counts of the Monte Carlo simulations as a function of regulation, where the mean regulation is 0.74%/V with a standard deviation of 0.07%/V and a maximum regulation of 0.88%/V.

With reference back to FIG. 4, the current generator stage 420 comprises a reference current generator 450 and an output circuit 460. The reference current generator 450 is configured to generate a stable current based on input voltage VDD from the voltage regulator stage 410, while the output circuit 460 is configured to copy the stable current generated by reference current generator 450 and output the current as reference current $I_{ref}$.

The reference current generator 350 and output circuit 360 of FIG. 3 are example circuit implementations of the reference current generator 450 and output circuit 460, respectively. That is, in some embodiments, the reference current generator 450 may be implemented as the circuit as shown in FIG. 3. For example, the reference current generator 450 may comprises first and second reference current generation devices 455 and 456 (also referred to herein as a first and second circuits, respectively) that may include one or more electrical components configured to generate first and second reference currents, which are inversely dependent upon PVT variations. That is, where the first reference current changes in one direction due to a PVT variation, the second reference current changes in the opposite direction. The first and second reference currents are combined (e.g., merged or summed) together, which results in a stable current in changes due to PVT variations are cancelled out due to the inverse relationship between the reference currents. In an example implementation, the first reference current generation devices 455 may be implemented as transistor M5 as shown in FIG. 3, which may operate to generate a PTAT current as the first reference current. The second reference current generation devices 456 may be implemented as transistors M1-M4 as shown in FIG. 3, which may operate to generate a CTAT current as the second reference current.

Additionally, in some implementations, the reference current generator 450 may also comprise startup device(s) 452, injection devices 454, and bias devices 458. The startup device(s) 452 may include one or more electrical components configured to remove degenerate points within the reference current generator 450, as well as reduce startup time by decreasing time period of the reference current generator 450 to settle responsive to ramping up an input voltage VDD. For example, the startup device(s) 452 (also referred to herein as startup circuit) may be coupled to one or more of the first and second reference current generation devices 455 and 456 at a node. The startup device(s) 452 is configured to be activated responsive to receiving the input voltage VDD from voltage regulator stage 410 and configured to charge the node to a non-zero current (e.g., non-degenerate point). Once charged (e.g., the output current $I_{ref}$ stabilizes), the startup device(s) 452 is deactivated and draws minimal to zero current.

The injection devices 454 (also referred to herein as injection circuit) may include one or more electrical components configured to generate a process-dependent current that shifts an output current $I_{ref}$ for fast process corners toward the typical and slow process corners. Shifting the output current $I_{ref}$ in this way, improves changes in the output current $I_{ref}$ due to process induced variations. The operation of the injection devices 454 may be similar to injection devices 436 of the reference voltage generator 430.

The bias devices 458 (also referred to herein as bias circuit) may include one or more electrical components configured to generate a bias voltage for the output circuit 460. For example, referring to FIG. 3, the bias devices 458 may operate to generate the voltage VBN applied to gate terminal of transistor M7.

The output circuit 460 may include one or more electrical components configured to copy the stable current generated from reference current generator 450 and output the current as reference current $I_{ref}$. As noted above, the output circuit 360 of FIG. 3 is an example circuit implementation of the output circuit 460.

Figure 8A:
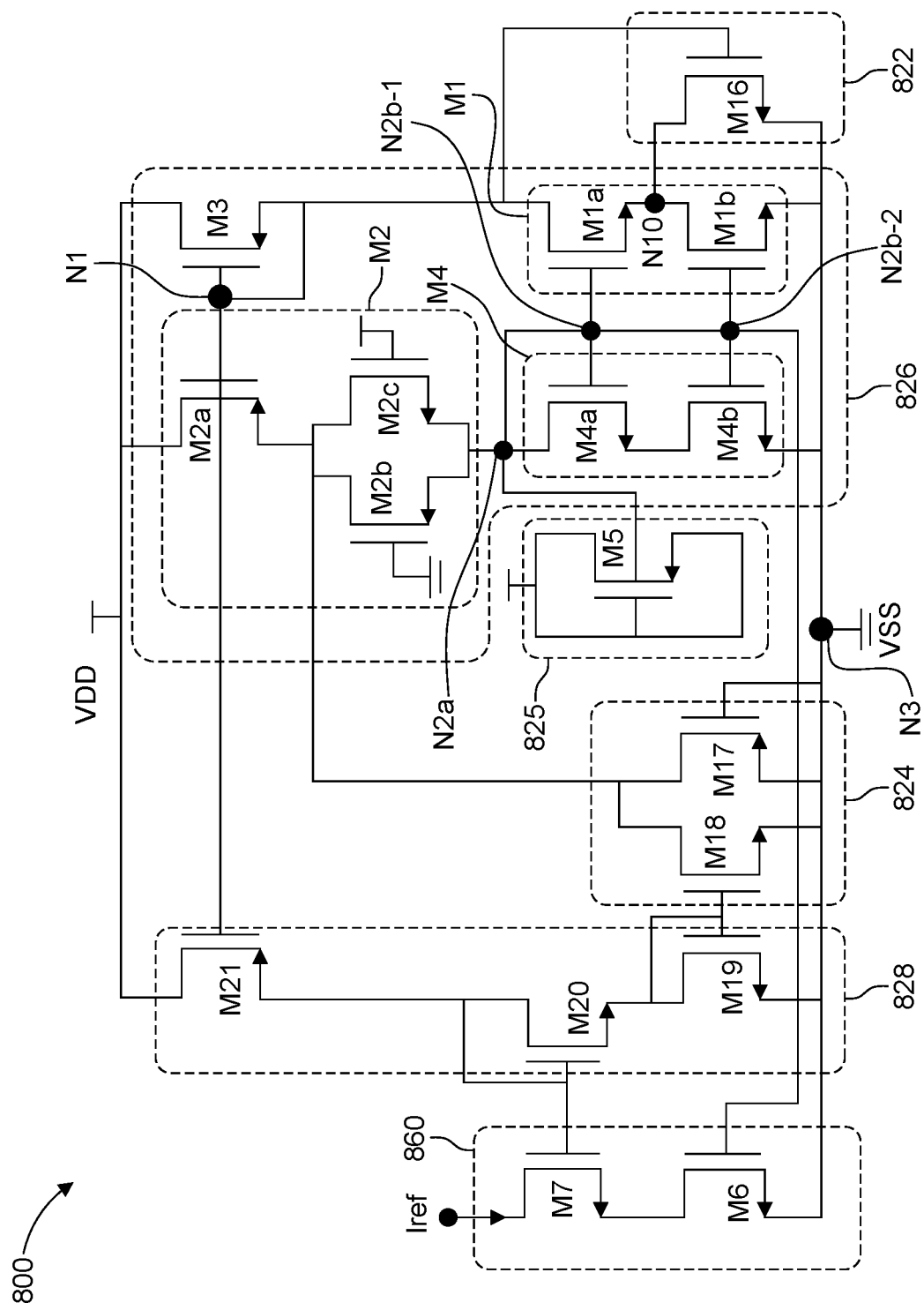
FIG. 8A depicts an example circuit implementation of a current generator stage included as part of the reference current generator of FIG. 4 according to embodiments of the disclosed technology.
Figure 8B:
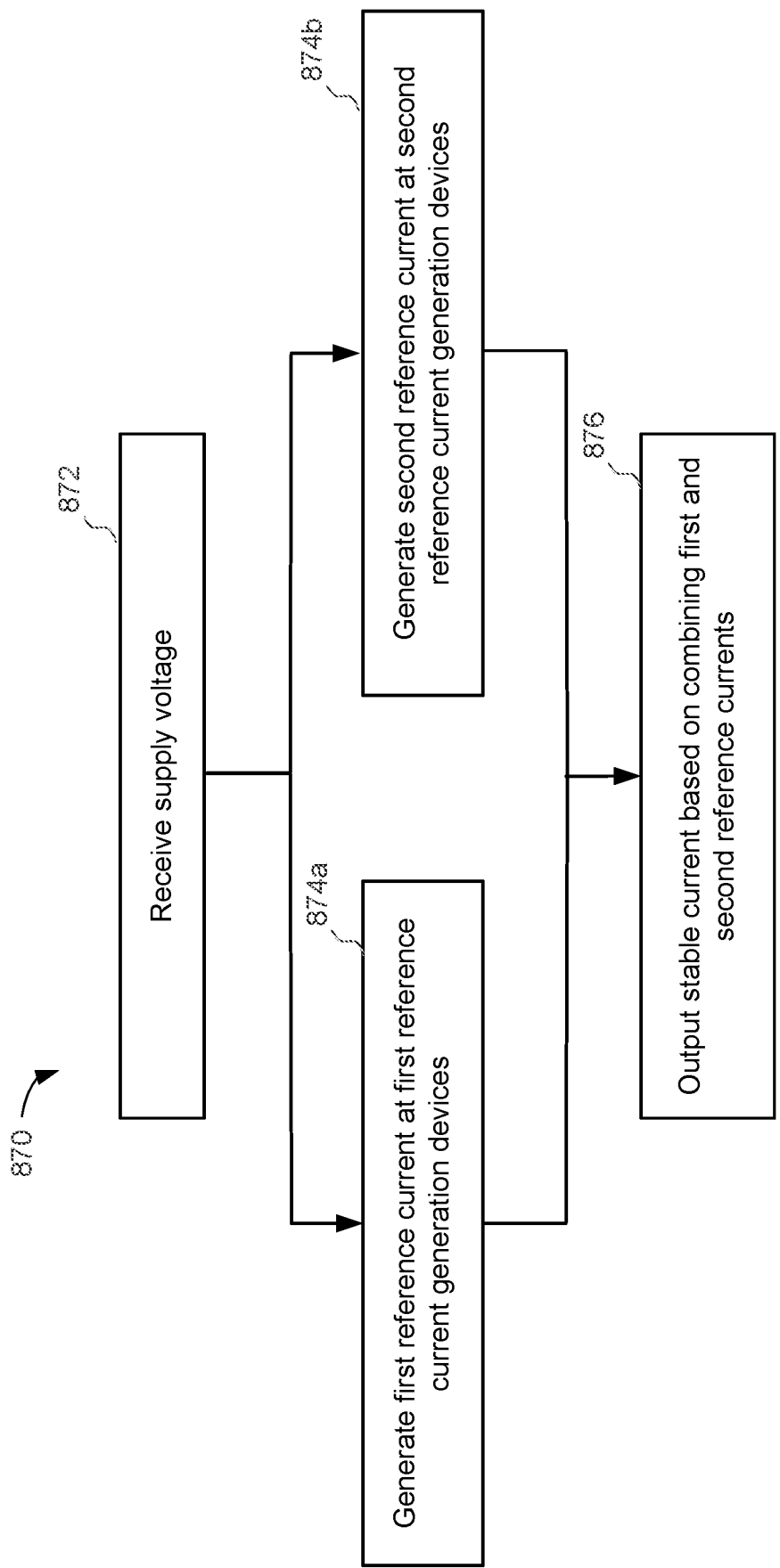
FIGS. 8B and 8C are flowcharts depicting example methods of operation of the circuit of FIG. 8A according to embodiments of the disclosed technology.

FIG. 8A depicts an example circuit implementation 800 of the current generator stage 420 according to embodiments of the disclosed technology. FIGS. 8A and 8B are flowcharts depicting example methods 870 and 880 of operation of the circuit 800 according to embodiments of the disclosed technology. The methods 870 and 880 will be described hereinafter in the context of the example circuit implementation 800. While method 870 is described in the context of example circuit 800, it will be understood that circuit 350 may be implemented to perform method 870.

Referring first to FIG. 8A, the circuit 800 comprises a plurality of MOSFETs that that are configured to generate a stable reference current $I_{ref}$. Bodies of pMOS transistors are connected to VDD and bodies of nMOS transistors are connected to VSS unless otherwise stated herein or shown in FIG. 8A.

The circuit 800 includes startup device 822, injection devices 824, first reference current generation devices 825, second reference current generation devices 826, bias devices 828, and output circuit 860. The circuit 800 comprises a plurality of MOSFETs that are included as part of startup device 822, injection devices 824, first reference current generation devices 825, second reference current generation devices 826, bias devices 828, and output circuit 860.

The first reference current generation devices 825 and second reference current generation devices 826 may be example circuitry for implementing first and second reference current generation devices 455 and 456 of FIG. 4 and includes transistors M2a, M2b, M3, M5, which may be pMOS transistors or other suitable semiconductor devices, and transistors M1a, M1b, M2c, M4a, and M4b, which may be nMOS transistors or other suitable semiconductor devices. Circuit 800 may be an example implementation of current generator stage 320, for example, the first reference current generation devices 825 and second reference current generation devices 826 may be an example implementation of reference current generator 350. Thus, similarly numbered transistors in circuit 800 refer to the same transistors of reference current generator 350 and/or a transistor of reference current generator 350 may be shown in FIG. 8A as one or more of transistors. For example, transistor M3 and M5 of circuit 800 correspond to transistors M3 and M5 of reference current generator 350. Furthermore, transistor M2 of reference current generator 350 corresponds to transistors M2a-M2c of circuit 800, transistor M1 of reference current generator 350 corresponds to transistors M1a and M1b, transistor M4 of reference current generator 350 corresponds to transistors M4a and M4b. Additionally, nodes in circuit 800 refer to similarly numbered nodes in FIG. 3, for example, node N1-N3.

As shown in FIG. 8A, drain terminals of transistors M2a and M3 receive voltage VDD, for example, from voltage regulator stage 410 of FIG. 4. The source terminal of transistor M3 is connected to its gate terminal and the gate terminal of transistor M2a, a drain terminal of transistor M1a, and gate terminal of transistor M16 at node N1. Source terminal of transistor M2a is connected to drain terminals of transistors M2b and M2c, which have gate terminals connected to VDD and VSS, respectively. The source terminals of transistors M2b and M2c are connected to node N2a, which is connected to a drain terminal of transistor M4a. The source terminal of transistor M4a is connected to the drain terminal of transistor M4b. Gate terminals of transistors M1a and M4a and gate terminals of M1b and M4b are connected to node N2b-1 and N2b-2 (collectively shown in FIG. 3 as node N2b), respectively, which is connected to node N2a. Body of transistor M5 is connected to node N2a, while the drain, source, and gate terminals are connected to VDD. Source terminals of transistors M1b and M4b are connected to VSS at node N3.

As described above with reference to FIG. 4, the first and second reference current generation devices 825 and 826 generate first and second reference currents, respectively, which are inversely dependent upon PVT variations. The first and second reference currents are combined, which results in a stable current in that changes due to PVT variations are cancelled out as a result of the inverse relationship between the reference currents. For example, referring to FIG. 8B, method 870 depicts a flowchart for generating a stable reference current using circuit 800 according to embodiments of the disclosed technology. Based on a received input voltage (e.g., voltage VDD) at block 872, first reference current generation devices 825 operate to generate a PTAT current as the first reference current (block 874a) and second reference current generation devices 826 operate to generate a CTAT current as the second reference current (block 874b). At block 876, the first and second reference currents combine at node N2a to provide a current that is stable to PVT variations due to combining the first and second references, which are exposed to the same PVT variations and are inversely related. For example, current sourced by current generation device 825 (e.g., transistor M5 is the PTAT current and current sourced by transistor M2a of current generation devices 826 is the CTAT current. The combined currents flows into the drain of transistor M4a via node N2a, which is relatively stable with respect to temperature variations.

For example, transistors M2a and M3 and transistors M1a-M4b operate to generate the CTAT current (block 874b). Transistor M2a-M2c and transistors M1a-M1b operate in triode region based on sizing the transistors properly, such that the gate to source voltage ($V_{GS}$) is above the threshold voltage ($V_{th}$) of the respective transistor and that the drain to source voltage ($V_{DS}$) is less than $V_{GS}$ minus $V_{th}$. Transistor M3 and transistors M4a and M4b are driven in saturation region, for example, by driving their respective $V_{GS}$ above their respective $V_{th}$ and driving their respective $V_{DS}$ at greater than or equal to $V_{GS}$ minus $V_{th}$. For example, the voltage at the gate terminals of M2a and M3 are the same due to being connected to node N1 and the voltage applied to their respective source terminals is VDD. Thus, properly sizing the respective transistors provides for different operating regions. As a result of transistors M2a, M1a, and M1b operating in triode region, the drain current across of M2a changes complementary to temperature variations e.g., it is a CTAT current. Transistors M2c and M2b are also full turned on devices operating in the triode regime. The on-resistance of these devices are adjusted to minimize the spread of process variations during corner simulations and their presence reduces temperature dependency of the output circuit. Transistors M2c and M2b are nonetheless optional, and circuit 800 does not require these transistors in order to operate. As noted above, while transistors M1a-M2b operate in the triode region, any susceptibility to variations in the supply voltage is addressed by the voltage regulator stage 410.

Additionally, transistor M5, which is functioning as a forward bias PN junction diode (also referred to herein PN diode M5) due to its body being connected to source terminals of transistors M2b and M2c and gate terminal of transistors M4a and M4b, operates to generate the PTAT (block 874a). As a result of the forward bias applied by the PN diode M5, the current generated at the body of the PN diode M5 will be proportional to temperature, thereby providing the PTAT current.

At node N2a, the PTAT current and CTAT current are summed together (block 876). As a result, temperature dependencies in the currents will be cancelled out, thereby generating a current (sum of the source current of transistor M5 and transistor M2a) into the drain of transistor M4a that is stable with relatively respect to temperature.

The startup devices 822 may be example circuitry for implementing startup devices 452 of FIG. 4 and includes transistor M16, which may be an nMOS transistor or another suitable semiconductor device. As shown in the illustrative example of FIG. 8A, the gate terminal of transistor M16 is connected to node N1, which is connected to gate and source terminals of transistor M2b and gate of transistor M2a. Drain terminal of transistor M16 is connected to the source terminal of transistor M1a and drain terminal of transistor M1b at node N10, while the source terminal of transistor M16 is connected to VSS at node N3. As described above with reference to FIG. 4, the startup devices 822 function to remove the degenerate point by discharging node N10 upon startup or reset (e.g., when the voltage VDD is ramped up or otherwise activated).

Figure 8C:
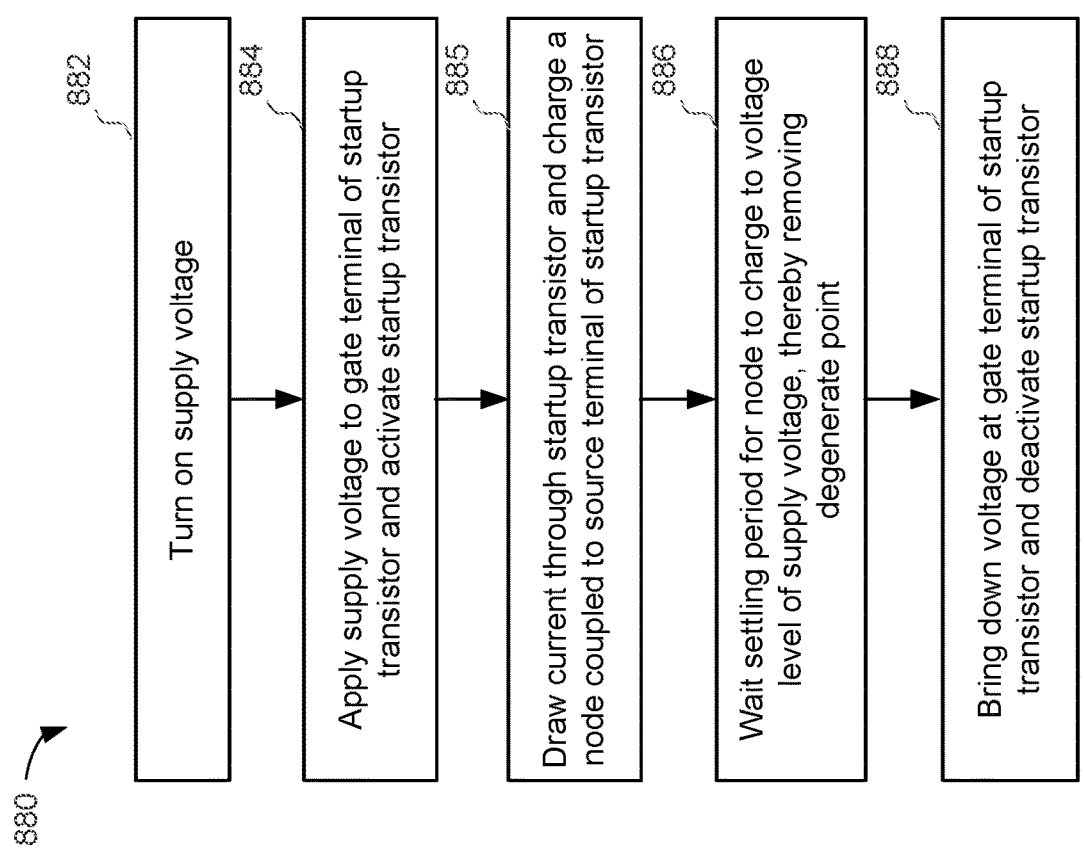

For example, referring to FIG. 8C, method 880 depicts a flowchart for removing a degenerate point of the circuit 800, via the startup devices 822, according to embodiments of the disclosed technology. Prior to receiving voltage VDD, the current in the circuit 800 is zero and the voltage at node N3 is zero. Responsive to the receiving input voltage VDD based on supply voltage VDD being turned on, at block 882, the voltage VDD is applied to the gate terminal of transistor M16 (also referred to herein as startup transistor). If the circuit traps in the degenerate point, the voltage of the nodes N2a and N10 remains low. However, when VDD is increased beyond the threshold voltage of transistor M16, transistor M16 turns ON and starts sinking current from node N10 and discharging node N1. This operation pushes the circuit 800 away from the degenerate point and toward a non-zero current (e.g., the designed target operating point). Once, VDD is fully ramped up and the circuit 800 has settled, $V_{GS}$ of transistor M16 will be reduced below its threshold voltage, which would mean its drain current will be almost zero. The input voltage VDD may be received from the voltage regulator stage 410 as described above. As the voltage applied to the gate terminal of transistor M16 ramps up from low voltage level VSS or GND to the voltage level VDD, the gate-to-source bias voltage ($V_{GS}$) (e.g., voltage at the gate terminal is VPP and voltage at the source terminal is zero) of M16 is brought up in excess of the threshold voltage of transistor M16, which turns transistor M16 ON (e.g., activated), block 884. Responsive to turning transistor M16 ON at block 885, transistor M16 draws current through its drain terminal, which charges node N3 to the supply voltage level VPP at block 884. Once node N3 is charged (e.g., after a settling period during which the node N3 is charged), the voltage at node N3 goes up forcing the current at node N3 to a non-zero current, thereby removing the degenerate point (e.g., zero current as explained above in connection with FIG. 4) at block 886. After the settling period, the gate terminal of transistor M16 is also brought down at block 888, which causes the $V_{GS}$ of transistor M16 to be reduced well below its threshold voltage, thereby turning transistor M16 OFF (e.g., deactivated). For example, at the target design point (e.g., non-zero current), the voltage of the node N1 is small. This ensures transistor M2a is in the triode regime. Having node N1 at a small voltage means at the target design point, $V_{GS}$ of transistor M16 would be very small, much less than the threshold voltage of transistor M16, which means after the circuit 800 has settled M16 will be OFF. As such, after the settling period, negligible current flows through transistor M16. As a result, the circuit 800 operates to generate a PVT insensitive output voltage, as described above in connection with FIG. 8B.

The injection devices 824 may be example circuitry for implementing injection devices 454 and includes transistor M17, which may be a pMOS transistor or another suitable semiconductor device, and transistor M18, which may be an nMOS transistor or another suitable semiconductor device. As shown in the illustrative example of FIG. 8A, drain terminals of transistors M17 and M18 are connected to source terminal of transistor M2a and drain terminals of transistors M2b and M2c. Source terminals of transistors M18 and M17 are connected to VSS at node N3. As described above with reference to FIG. 4, the injection devices 824 generate a process-dependent current that shifts the stable current at node N2b-2 for fast process corners toward the typical and slow process corners, thereby improving changes in the output current $I_{ref}$ due to process induced variations. For example, transistors M17 and M18 may be process-dependent transistors that operate to sink current from the drain terminals of transistors M2b and M2c by generating a small CTAT current (e.g., small amplitude) at the drain terminals of transistors M18 and M17. For example, transistors M17 and M18 operate to copy the current at transistor M2a and generate a current that is significantly smaller than the current flowing through transistor M1a. The amount or amplitude of the CTAT current generated, and thus the amount of current sunk, is dependent on the process corner. For example, at SS process corners, where the threshold voltage of transistors M18 and M17 become relatively large (e.g., relative to the fast-fast corner), the amplitude of the current generated by these transistors (and thus sunk from the circuit 800) becomes negligible, almost zero. Whereas, at FF process corners, where the threshold voltage is relatively small, the amplitude of the current generated by these transistors becomes much larger. That is, at SS process corners the injection devices 824 pull negligible current from the transistors M2b and M2c and the current in the circuit 800 is negligibly impacted, whereas at FF process corners the injection devices 824 generate a current that shifts the current in circuit 800 down toward the current in the circuit at the SS corner. As a result, the amount of process induced variations in the current and the standard deviation are reduced.

The bias devices 828 may be example circuitry for implementing bias devices 458 and includes transistor M21, which may be a pMOS transistor or another suitable semiconductor device, and transistors M19 and M20, which may be nMOS transistors or another suitable semiconductor devices. As shown in the illustrative example of FIG. 8A, drain terminal of transistor M21 is connected to voltage VDD and its gate terminal is connected to node N1 (e.g., to gate terminals of transistors M2a and M2b). Source terminal of transistor M21 is connected to drain terminal and gate terminal of transistor M20, which has a source terminal connected drain and gate terminals of transistor M19. The gate terminal of transistor M18 is connected to the gate and drain terminals of transistor M19, along with the source terminal of transistor M20. The source terminal of transistor M19 is connected to VSS. As described above with reference to FIG. 4, the bias devices 828 generate a bias voltage for the output circuit 620. For example, bias devices 828 generates a bias voltage for transistor M7. Referring to FIG. 3, bias devices 828 may be utilized to generate VBN shown in FIG. 3.

The output circuit 860 may be example circuitry for implementing output circuit 460 and includes transistors M6 and M7, which may be nMOS transistors or another suitable semiconductor devices. As noted above, similarly numbered transistors in circuit 800 may refer to the same transistors in output circuit 360, for example, transistor M6 and M7 of circuit 800 correspond to transistors M6 and M7 of output circuit 360. As shown in the illustrative example of FIG. 8A, gate terminal of transistor M6 is connected to node N2b-2, its source terminal is connected to node N2, and its drain terminal connected to source terminal of transistor M7 (referred to herein as cascode transistor M7). The gate terminal of cascode transistor M7 is connected to gate and drain terminals of transistor M20 and the reference current $I_{ref}$ is output from drain terminal of transistor M7. As described above with reference to FIG. 4, the output circuit 860 copies the stable current generated from first and second reference current generation devices 825 and 826 and output the current as reference current $I_{ref}$. For example, gate terminals of transistor M4b, M1a, and M1b are connected to the gate terminal of M6, source terminals M4a, M4b, M1a, M1b, and M6 are connected at node N3, and the sizes of transistors M4a, M4b, M1a, and M1b are approximately the same as transistor M6 or a ratio of the sizes. The generated reference current is the current out of the drain terminal of transistor M4a times the half of the ratio of the width of transistor M6 to transistor M4a. If the width of transistor M6 to be twice the width of transistor M4b, the current at the drain terminal of transistor M6 will be approximately the same as the drain current of M4b. Additionally, cascode transistor M7 functions to increase output resistance of at the drain terminal of cascode transistor M7 and ensure the reference current as a result of voltage fluctuations at the drain terminal of M7 does not change significantly. For example, the higher the output resistance, the less change in the current due to variations. By maintaining a constant voltage at the node between transistors M7 and M6, temperature response of the output current can be improved and ensure that the current does not change with a change in voltage at this node.

FIGS. 9A and 9B are examples plots illustrating stability, with respect to PVT variations, of reference current $I_{ref}$ according to embodiments of the disclosed technology. Each plotted line of FIGS. 9A and 9B corresponds to an individual process corner (e.g., 15 corners in these examples), with FIG. 9A illustrating the current $I_{ref}$ generated by the reference current generator 400 of FIG. 4 (and specifically current generator stage 420 implemented as circuit 800) plotted as a function of temperature and FIG. 9B illustrating the current $I_{ref}$ generated by the reference current generator 400 plotted as a function of supply voltage.

As shown in FIG. 9A, for each process corner, the current $I_{ref}$ with respect to temperature is substantially constant. For example, with reference to FIG. 9A, the mean current across all corners is 222.8 µA, with a standard deviation of 7.6 µA and a temperature coefficient of less than 279 ppm/° C. Thus, subject to process variations, the embodiments disclosed herein has good TC as compared to conventional systems, as described below in connection with Table 1.

Similarly, FIG. 9B shows that the current $I_{ref}$ with respect to the supply voltage is relatively constant. For example, with reference to FIG. 9B, the mean current across all corners is 222.8 µA, with a standard deviation of 7.6 µA and a regulation of less than 2.82%/V (e.g., how the output voltage changes with respect to supply voltage). Thus, subject to process variations, the embodiments disclosed herein exhibit good regulation within a given process variation.

Figure 10A:
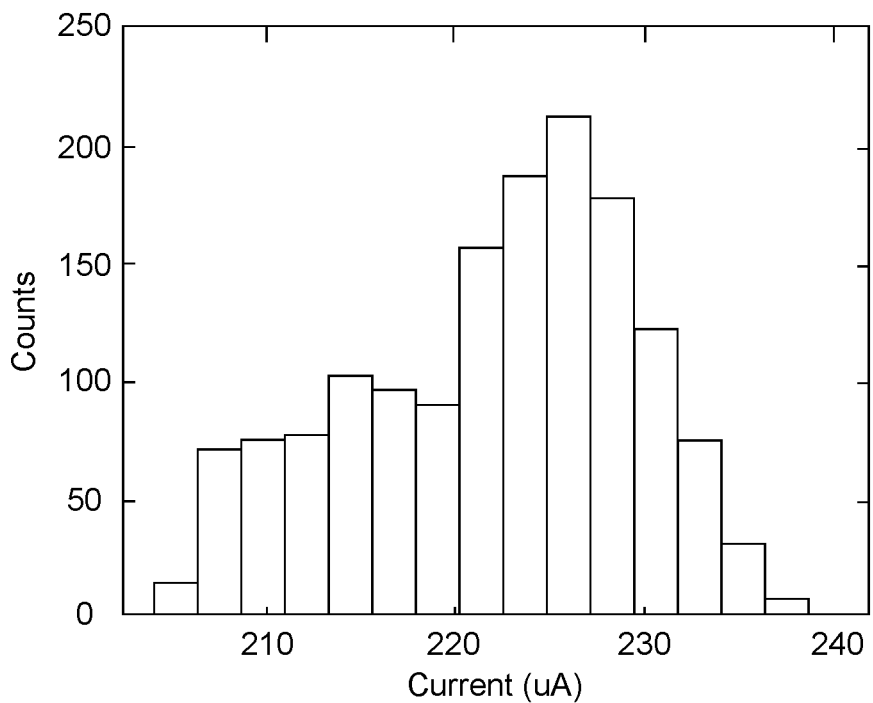
FIGS. 10A-10C are histograms of Monte Carlo simulations of the current generator stage of FIG. 8A.
Figure 10B:
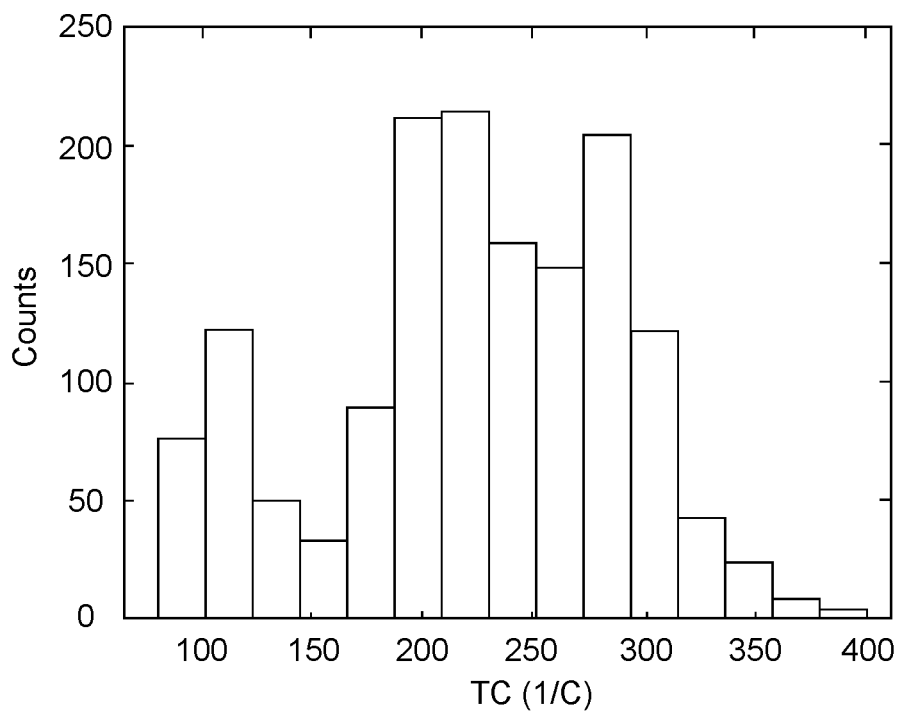
Figure 10C:
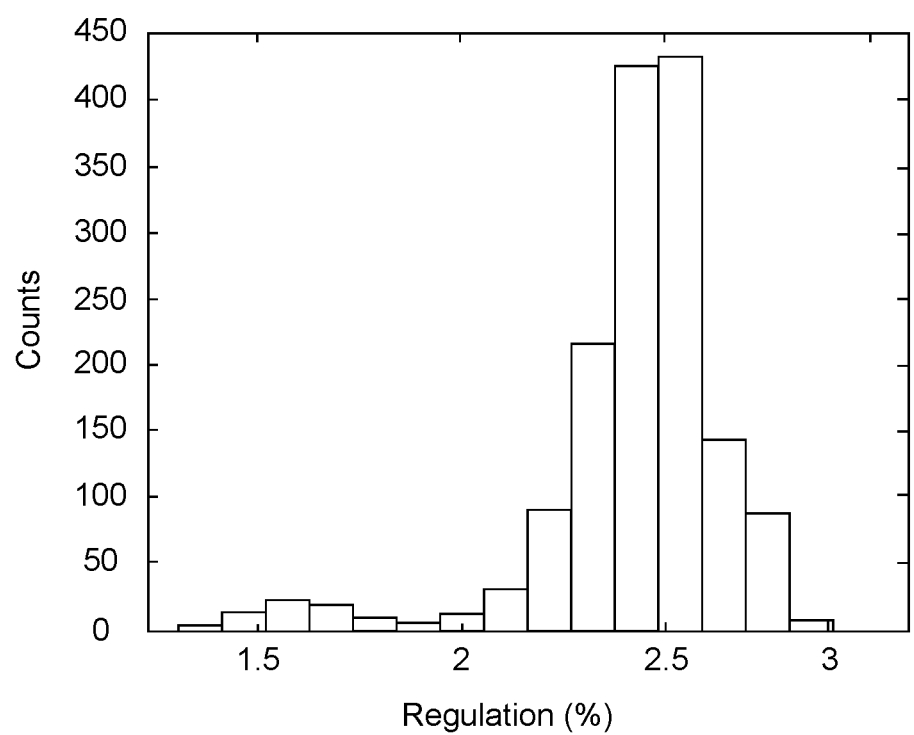

FIGS. 10A-10C are histograms of Monte Carlo simulations of the reference current generator 400 across all corners. To generate FIGS. 10A-10C, 100 Monte Carlo simulations were performed across all 15 process corners, thereby providing 15,000 simulation points. FIG. 10A illustrates counts of the Monte Carlo simulations as a function of current $I_{ref}$, where the mean 222.8 µA with a standard deviation of 7.6 µA. FIG. 10B illustrates counts of the Monte Carlo simulations as a function of temperature coefficient (TC), where the mean TC is 220 ppm/° C. with a standard deviation of 65 ppm/° C. and a maximum TC of 393 ppm/° C. FIG. 10C illustrates counts of the Monte Carlo simulations as a function of regulation, where the mean regulation is 2.5%/V with a standard deviation of 0.23%/V and a maximum regulation of 2.99%/V.

Figure 11:
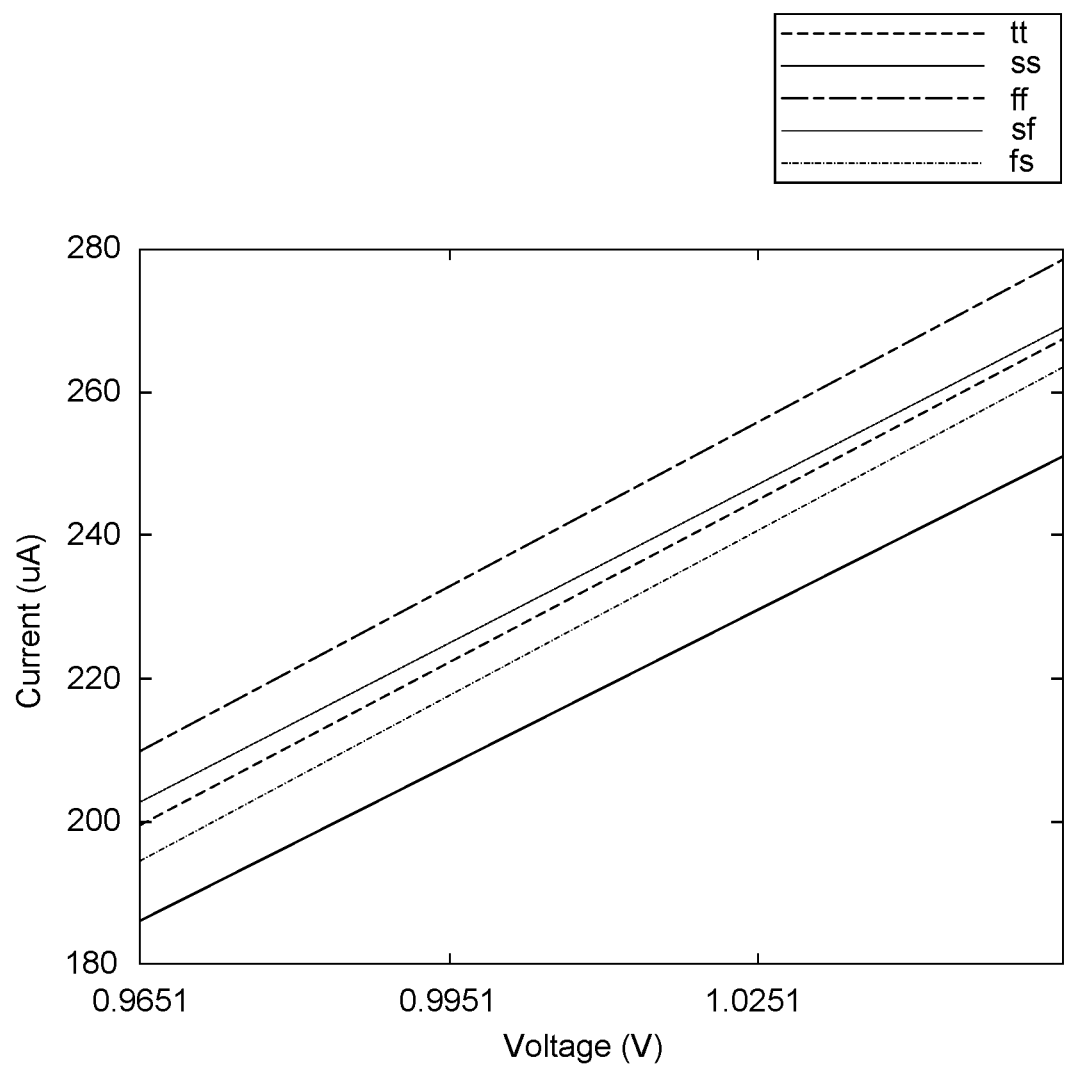
FIG. 11 is an example plot illustrating an impact of a voltage regulator stage, according to some embodiments of the disclosed technology, included as part of the reference current generator of FIG. 4.

FIG. 11 is an example plot illustrating the impact of the voltage regulator stage 410 of FIG. 4 according to embodiments of the disclosed technology. FIG. 11 is a plot of current $I_{ref}$ generated by reference current generator 400 (e.g., outputted by current generator stage 420 implemented as circuit 800), where the voltage regulator stage 410 for providing a stable output voltage $V_{ref}$ is not utilized. The lines plotted in FIG. 11 correspond to FF, TT, SS, FS, and SF process corners, as indicated in the legend.

As shown in FIG. 11, the current $I_{ref}$, regardless of the process corner, increases linearly with supply voltage. In the illustrative example of FIG. 11, the regulation is less than 337%/V. Whereas, when the voltage regulator stage 410 is used, the regulation is reduced by over 400 times to 0.83%/V, as described with reference to FIG. 6B.

Figure 12A:
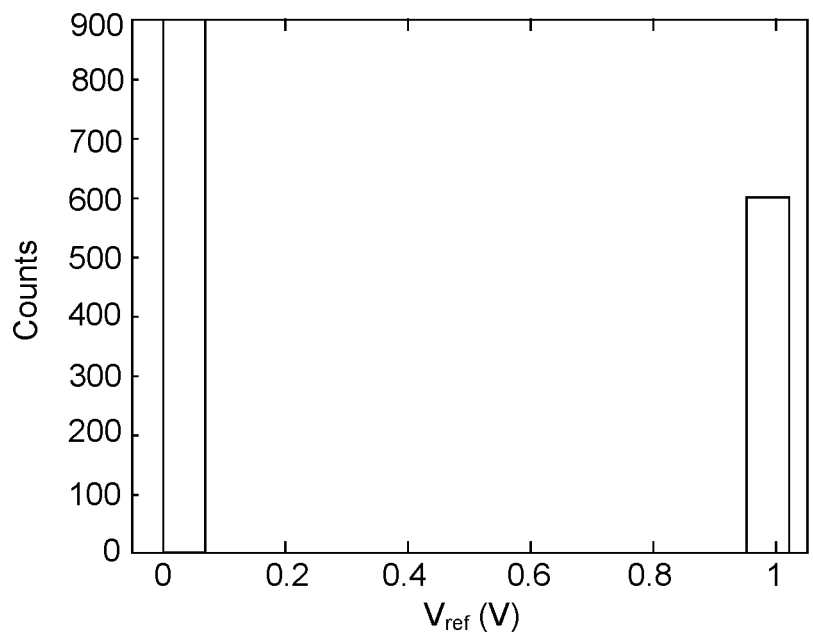
FIGS. 12A and 12B are histograms of Monte Carlo simulations illustrating the impact of startup devices on a voltage regulator stage, according to some embodiments of the disclosed technology, included as part of the reference current generator of FIG. 4.
Figure 12B:
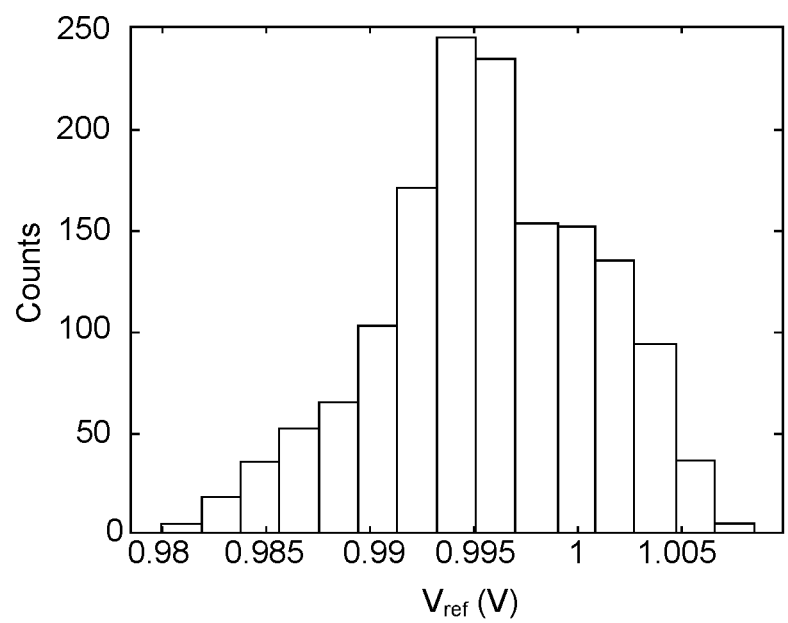

FIGS. 12A and 12B are histograms of Monte Carlo simulations illustrating the impact of startup devices 432 of the voltage regulator stage 410 of FIG. 4 according to embodiments of the disclosed technology. FIG. 12A is a histogram of 100 Monte Carlo simulations of the voltage regulator stage 410 of FIG. 4 across all 15 corners, without the startup devices 432. FIG. 12B is a histogram of 100 Monte Carlo simulations of the voltage regulator stage 410 of FIG. 4 across all 15 corners, with the startup devices 432. As shown in FIG. 12A, a degenerate point of $V_{ref}$ enforces the output voltage $V_{ref}$ to zero volts in many cases if startup devices 432 are not used. Whereas, if startup devices 432 are used, the degenerate point is removed and the circuit turns on successfully in all cases, as shown in FIG. 12B.

FIGS. 13A-13D are example plots illustrating the impact of injection devices 436 of the voltage regulator stage 410 of FIG. 4 according to embodiments of the disclosed technology.

Figure 13A:
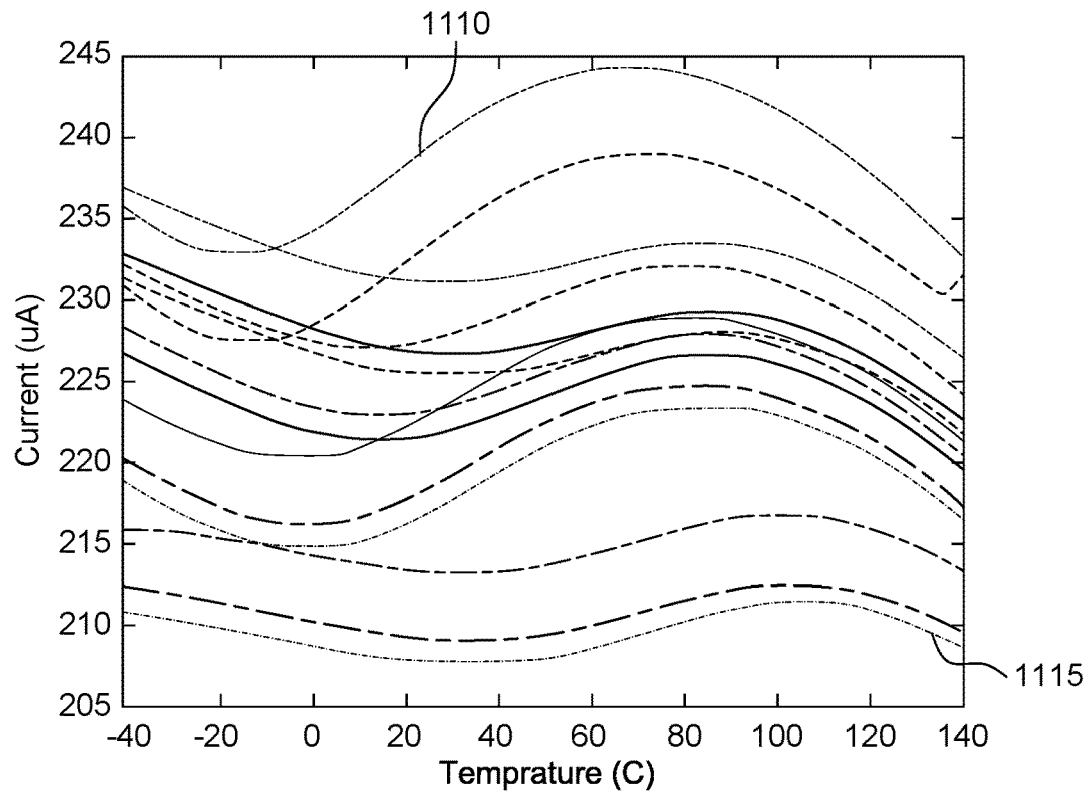
FIGS. 13A-13D are example plots illustrating the impact of injection devices on a voltage regulator stage, according to some embodiments of the disclosed technology, included as part of the reference current generator of FIG. 4.
Figure 13B:
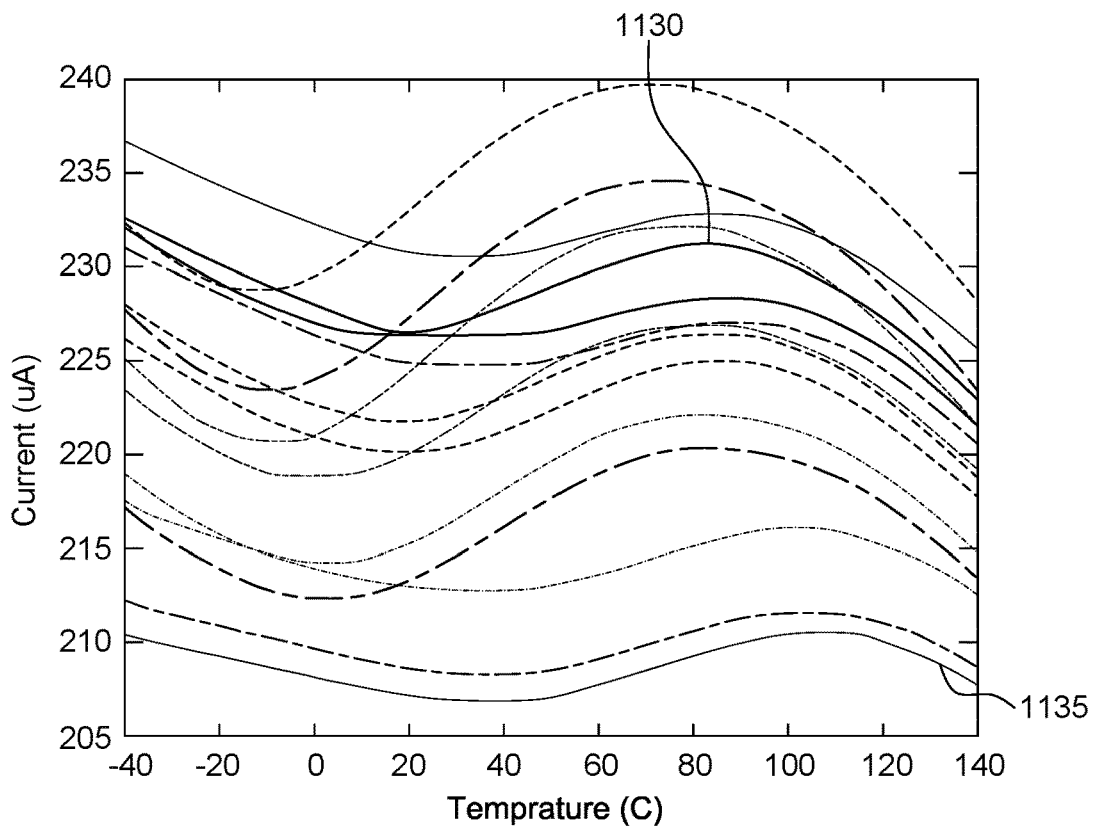

FIGS. 13A and 13B are plots illustrating the current $I_{ref}$ generated by the reference current generator 400 of FIG. 4 (e.g., outputted by the current generator stage 420 implemented as circuit 800) plotted as a function of temperature, where each plotted line corresponds to an individual process corner (e.g., 15 process corners). FIG. 13A is generated in a case where the voltage regulator stage 410 does not include injection devices 436, while FIG. 13B is generated in a case where the voltage regulator stage 410 does include injection devices 436. Line 1110 of FIG. 13A and line 1130 of FIG. 13B correspond to current generated at an FF corner with and without injection devices, respectively. Line 1115 of FIG. 13A and line 1135 of FIG. 13B correspond to current generated at a SS corner with and without injection devices 436, respectively. Thus, as seen by comparing FIGS. 13A and 13B, the injection devices 436 operate to reduce the output current at the FF corner, while negligibly impacting the output current at the SS corner.

Figure 13C:
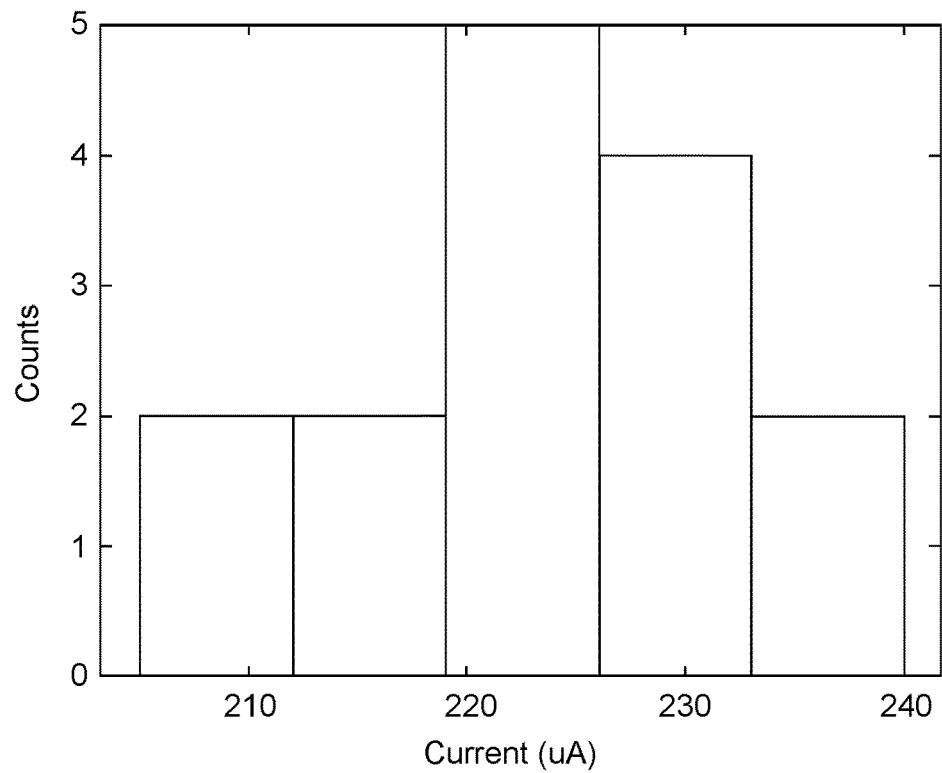
Figure 13D:
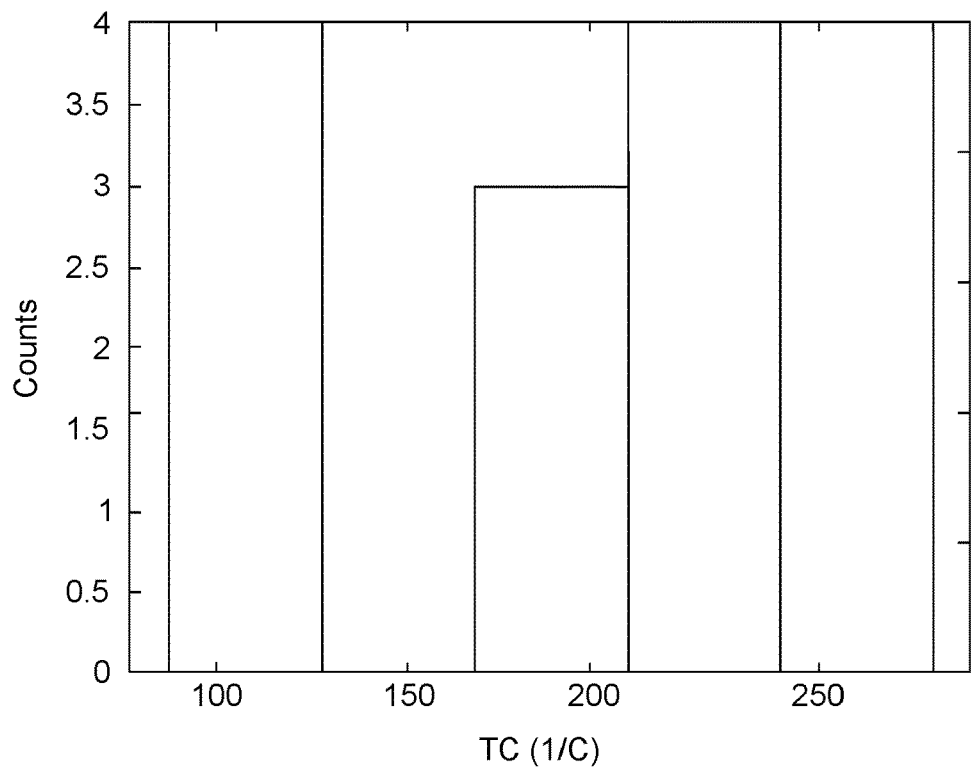

FIGS. 13C and 13D are histograms of Monte Carlo simulations performed without injection devices 436. As seen in FIG. 13C, the mean current is 223.3 µA with a standard deviation of 8.62 µA (e.g., 3.8%), while the mean current from the histogram of FIG. 10A is 222.7 µA with a standard deviation of 7.6 µA (e.g., 3.4%). Thus, the injection devices 436 function to reduce the standard deviation of the output current. FIG. 13D shows a mean TC of 191 ppm/° C. with a standard deviation of 65 ppm/° C., which is consistent with the results of FIG. 10B.

Figure 14A:
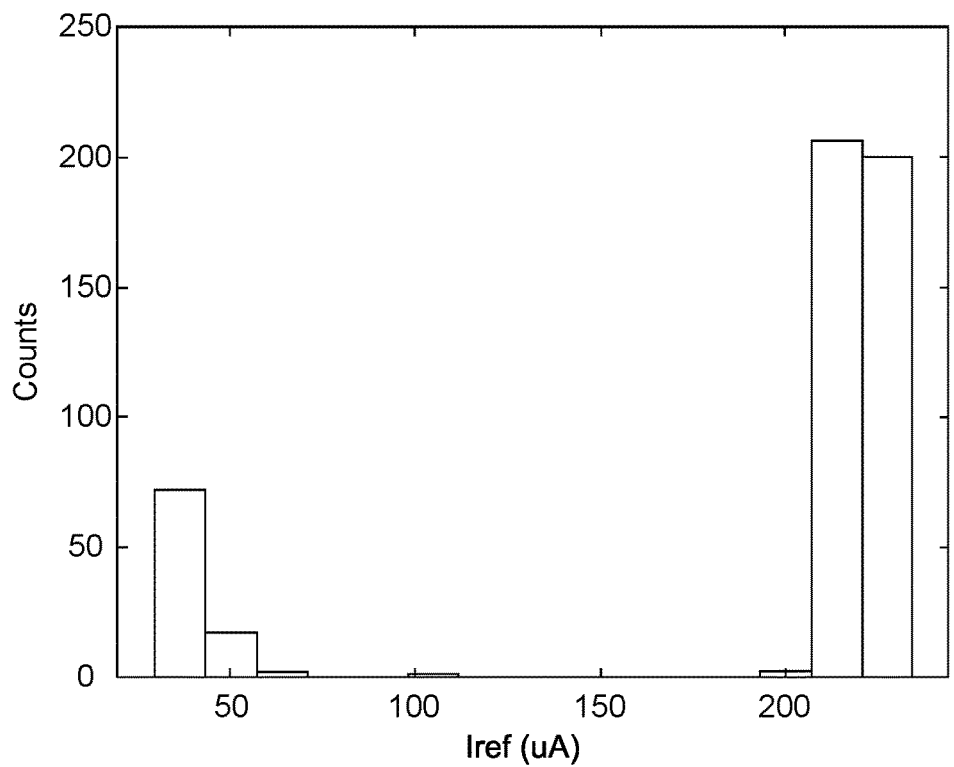
FIGS. 14A and 14B are histograms of Monte Carlo simulations illustrating the impact of startup devices on a current generator stage, according to some embodiments of the disclosed technology, included as part of the reference current generator of FIG. 4.
Figure 14B:
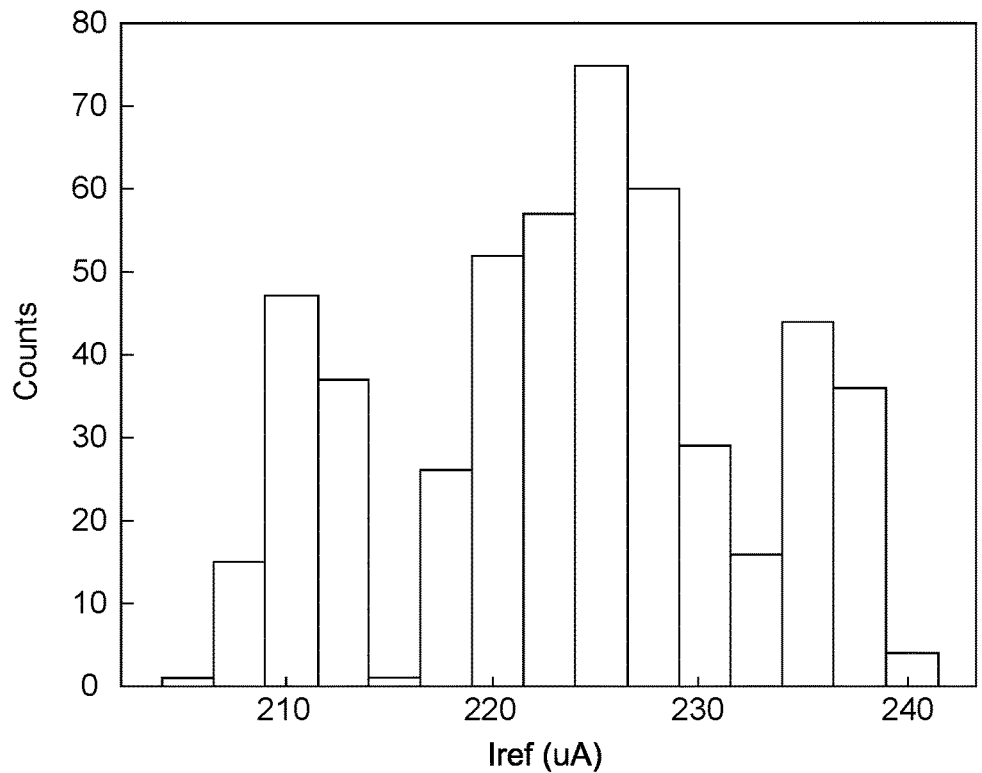

FIGS. 14A and 14B are histograms of Monte Carlo simulations illustrating the impact of startup devices 452 of the current generator stage 420 of FIG. 4 according to embodiments of the disclosed technology. FIG. 14A is a histogram of 100 Monte Carlo simulations of the current generator stage 420 across all 15 corners, without the startup devices 452. FIG. 14B is a histogram of 100 Monte Carlo simulations of the current generator stage 420 across all 15 corners, with the startup devices 452. As shown in FIG. 14A, a degenerate point of $I_{ref}$ enforces the output voltage $I_{ref}$ to zero volts in many cases if startup devices 452 are not used. Whereas, if startup devices 452 are used, the degenerate point is removed and the circuit turns on successfully in all cases, as shown in FIG. 14B.

Table 1 below compares the embodiments of the disclosed technology, for example in column 8 (e.g., reference current generator 400 of FIG. 4) against comparative examples 1-7 of conventional current refence generating circuits. As shown in Table 1, embodiments disclosed herein provide for a larger range of temperature (e.g., −40 to 140° C.) across which output current $I_{ref}$ is relatively stable, e.g., mean TC (µ) of 220 ppm/° C. with a standard deviation (σ) of 65 ppm/° C. Additionally, embodiments disclosed herein provide for a range of supply voltage across which output current $I_{ref}$ is also relatively stable, e.g., mean regulation (μ) of 2.5%/V with a standard deviation (σ) of 0.23%/V. For example, while TC results for comparative example 1-3 and 4 are less then the disclosed embodiments, the range over which these TC results are achieved is narrower than the embodiments disclosed herein. Similarly, line regulation results for comparative examples 1, 3, 4, and 7 may be smaller than the embodiments disclosed herein, but again the temperature ranges are narrower.

Furthermore, the TC results of the disclosed embodiments are achieved without trimming, for example, by calibrating the circuit for process variations. Whereas, comparative examples 3-5 each require trimming to achieve their respective results.

store data for use by the processor 1515. In certain embodiments, a cache 1520 may be smaller and faster than the memory 1530, and may duplicate data in frequently-used locations of the memory 1530, or the like. In certain embodiments, a processor 1515 may include a plurality of caches 1520. In various embodiments, a cache 1520 may include one or more types of memory media for storing data, such as static random access memory (SRAM) 1522, three-dimensional memory 1550, or the like. For example, in one embodiment, a cache 1520 may include SRAM 1522. In another embodiment, a cache 1520 may include three-dimensional memory 1550. In a certain embodiment, a cache 1520 may include a combination of SRAM 1522, three-dimensional memory 1550, and/or other memory media types.

TABLE 1

| | | Comp. Ex. [1] | Comp. Ex. [3] | Comp. Ex. [4] | Comp. Ex. [5] | Comp. Ex. [6] | Comp. Ex. [9] | Comp. Ex. [10] | Disclosed Embodiments |
|---|---|---|---|---|---|---|---|---|---|
| Supply Range (V) | | — | 2.4-3 | 1-1.2 | >2.3 | 1.2 | >0.4 | 1 | 1.8-1.3 | 1.75-1.91 |
| Line Regulation (%/V) | μ | 0.5 | 100 | <1 | 0.58 | 2.5 | — | 0.2 | 2.5 |
| | σ | — | — | — | — | — | — | — | 0.23 |
| Reference current (μA) | μ | 10 | 7.81 | 16:50 | $20 \times 10^{-6}$ | $1.2 \times 10^{-6}$ | 144 | 0.1 | 222.7 |
| | σ | — | ~4.5% | — | — | — | ~2.5% | — | 3.4% |
| Temperature range (° C.) | | — | −40:80 | 0:100 | 0:80 | 0:80 | −20:60 | 0:100 | 0:80 | −40:140 |
| TC (ppm/° C.) | μ | 130 | 24.9 | <130 | 780 | 470 | 185 | 520 | 220 |
| | σ | — | — | — | — | — | — | — | 65 |
| Trimming | | — | NO | NO | Nonvolatile memory | Digital | Digital | NO | NO | NO |

Figure 15:
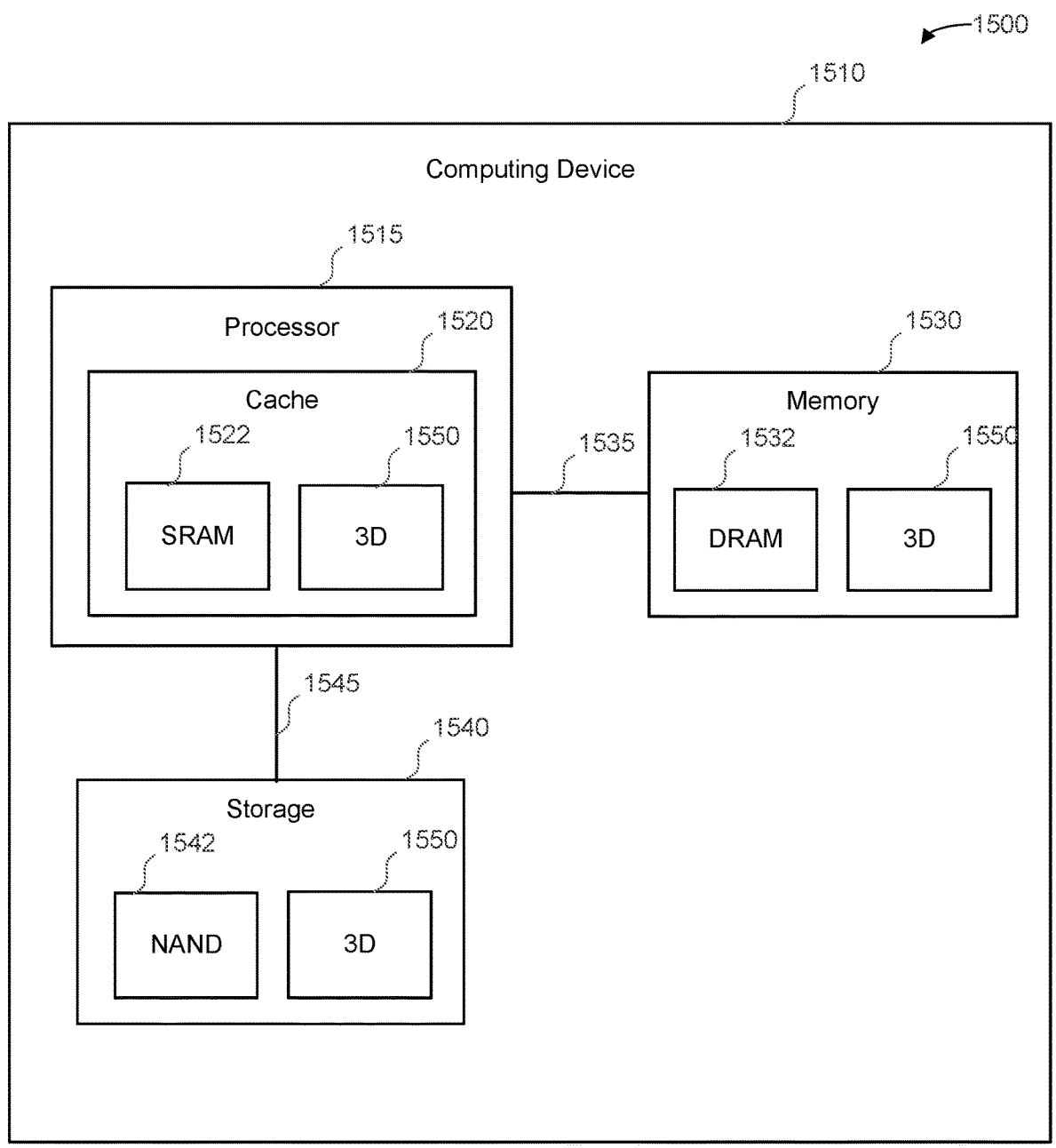
FIG. 15 is a schematic block diagram of a system in which a reference current generator according to example embodiments of the disclosed technology may be implemented.

FIG. 15 depicts a system 1500 comprising three-dimensional memory 1550. The system 1500 may include one or more reference current generator according to embodiments of the disclosed technology, such as those depicted in FIGS. 3, 4, 5, and/or 8. In the depicted embodiment, the system includes a computing device 1510. In various embodiments, a computing device 1510 may refer to any electronic device capable of computing by performing arithmetic or logical operations on electronic data. For example, a computing device 1510 may be a server, a workstation, a desktop computer, a laptop computer, a tablet, a smartphone, a control system for another electronic device, a network attached storage device, a block device on a storage area network, a router, a network switch, or the like. In certain embodiments, a computing device 1510 may include a non-transitory, computer readable storage medium that stores computer readable instructions configured to cause the computing device 1510 to perform steps of one or more of the methods disclosed herein.

In the depicted embodiment, the computing device 1510 includes a processor 1515, a memory 1530, and storage 1540. In various embodiments, a processor 1515 may refer to any electronic element that carries out the arithmetic or logical operations performed by the computing device 1510. For example, in one embodiment, the processor 1515 may be a general-purpose processor that executes stored program code. In another embodiment, a processor 1515 may be a field-programmable gate array (FPGA), an application-specific integrated circuit (ASIC), or the like, that operates on data stored by the memory 1530 and/or the storage 1540. In a certain embodiment, a processor 1515 may be a controller for a storage device (e.g., on a storage area network), a networking device, or the like.

In the depicted embodiment, the processor 1515 includes a cache 1520. In various embodiments, a cache 1520 may The memory 1530, in one embodiment, is coupled to the processor 1515 by a memory bus 1535. In certain embodiments, the memory 1530 may store data that is directly addressable by the processor 1515. In various embodiments, a memory 1530 may include one or more types of memory media for storing data, such as dynamic random access memory (DRAM) 1532, three-dimensional memory 1550, or the like. For example, in one embodiment, a memory 1530 may include DRAM 1532. In another embodiment, a memory 1530 may include three-dimensional memory 1550. In a certain embodiment, a memory 1530 may include a combination of DRAM 1532, three-dimensional memory 1550, and/or other memory media types.

The storage 1540, in one embodiment, is coupled to the processor 1515 by a storage bus 1545. In certain embodiments, the storage bus 1545 may be a peripheral bus of the computing device 1510, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In various embodiments, the storage 1540 may store data that is not directly addressable by the processor 1515, but that may be accessed via one or more storage controllers. In certain embodiments, the storage 1540 may be larger than the memory 1530. In various embodiments, a storage 1540 may include one or more types of storage media for storing data, such as a hard disk drive, NAND flash memory 1542, three-dimensional memory 1550, or the like. For example, in one embodiment, a storage 1540 may include NAND flash memory 1542. In another embodiment, a storage 1540 may include three-dimensional memory 1550. In a certain embodiment, a storage 1540 may include a combination of NAND flash memory 1542, three-dimensional memory 1550, and/or other storage media types.

In various embodiments, three-dimensional memory 1550 may be used to store data in a cache 1520, memory 1530, storage 1540, and/or another component that stores data. For example, in the depicted embodiment, the computing device 1510 includes three-dimensional memory 1550 in the cache 1520, memory 1530, and storage 1540. In another embodiment, a computing device 1510 may use three-dimensional memory 1550 for memory 1530, and may use other types of memory or storage media for cache 1520 or storage 1540. Conversely, in another embodiment, a computing device 1510 may use three-dimensional memory 1550 for storage 1540, and may use other types of memory media for cache 1520 and memory 1530. Additionally, some types of computing device 1510 may include memory 1530 without storage 1540 (e.g., in a microcontroller) if the memory 1530 is non-volatile, may include memory 1530 without a cache 1520 for specialized processors 1515, or the like. Various combinations of cache 1520, memory 1530, and/or storage 1540, and uses of three-dimensional memory 1550 for cache 1520, memory 1530, storage 1540, and/or other applications will be clear in view of this disclosure.

In various embodiments, the three-dimensional memory 1550 may include one or more chips, packages, die, or other integrated circuit devices comprising three-dimensional memory arrays with multiple layers of memory cells, disposed on one or more printed circuit boards, storage housings, and/or other mechanical and/or electrical support structures. For example, one or more dual inline memory modules (DIMMs), one or more expansion cards and/or daughter cards, a solid-state-drive (SSD) or other storage device, and/or another memory and/or storage form factor may comprise the three-dimensional memory 1550. The three-dimensional memory 1550 may be integrated with and/or mounted on a motherboard of the computing device 1510, installed in a port and/or slot of the computing device 1510, installed on a different computing device 1510 and/or a dedicated storage appliance on a network, in communication with a computing device 1510 over an external bus, or the like.

The three-dimensional memory 1550, in various embodiments, may include one or more memory dies. A memory die may include multiple layers of memory cells in a three-dimensional memory array. In various embodiments, three-dimensional memory may include magnetoresistive RAM (MRAM), phase change memory (PCM), resistive RAM (ReRAM), NOR Flash memory, NAND Flash memory, Silicon-Oxide-Nitride-Oxide-Silicon (SONOS) memory, or the like.

In certain embodiments, the three-dimensional memory 1550 may include a plurality of planar memory cells forming a three-dimensional array, a plurality of word lines extending horizontally across the layers (e.g., in-plane), and a plurality of selector columns or pillars extending vertically through the plurality of layers. In further embodiments, the selector columns or pillars may be coupled to the memory cells, and may include central conductors surrounded by one or more concentric selective layers. In various embodiments, one or more selective layers may permit an electrical current through a cell, between a word line and a central conductor, in response to a voltage satisfying a threshold. In certain embodiments, a selector column or pillar that extends through a plurality of layers of planar memory cells may facilitate reading to or writing from individual memory cells by limiting leakage current through other cells. Additionally, in further embodiments, forming a selector pillar or column that extends through a plurality of layers may simplify manufacturing compared to forming selector devices in individual layers alternating with memory cell layers.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In one embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

What is claimed is:

1. A reference current generator circuit comprising:
   a first circuit configured to generate a first current proportional to absolute temperature;
   a second circuit comprising a first transistor, a second transistor, a third transistor, and a fourth transistor, wherein the second circuit is configured to generate a second current complementary to absolute temperature based on the first and second transistors operating in respective triode regions and the third and fourth transistors operating in respective saturation regions; and
   a node, connected to the first and second circuit, at which the second current compensates the first current;
   wherein source terminals of the second and third transistors are connected to an input voltage, drain terminals of the second and fourth transistors are connected to the node, a gate terminal of the second transistor is connected to gate and drain terminals of the third transistor and to a drain terminal of the first transistor, and a gate terminal of the fourth transistor is connected to the node and to a gate terminal of the first transistor;
   wherein when a respective transistor is operating in a respective triode region its gate to source voltage is greater than its threshold voltage based on the input voltage, and its drain to source voltage is less than a difference between its gate to source voltage and its threshold voltage; and
   wherein when a respective transistor is operating in a respective saturation region its gate to source voltage is greater than its threshold voltage based on the input voltage, and its drain to source voltage is greater than the difference between its gate to source voltage and its threshold voltage.

2. The reference current generator circuit of claim 1, wherein the first and fourth transistors are n-channel metal-on-semiconductor field-effect transistors (MOSFETs) and the second and third transistors are p-channel MOSFETs.

3. The reference current generator circuit of claim 1, wherein the first circuit generates the first current using a forward bias PN junction diode.

4. The reference current generator circuit of claim 3, wherein the first circuit comprises a fifth transistor, the fifth transistor comprising a body connected to the node and a gate terminal connected to the input voltage.

5. The reference current generator circuit of claim 4, wherein the third transistor is a p-channel metal-on-semiconductor field-effect transistors (MOSFET).

6. The reference current generator circuit of claim 1, further comprising:
a startup circuit connected to the first transistor, the startup circuit configured to charge the first transistor to a non-zero current.

7. The reference current generator circuit of claim 1, further comprising:
an injection circuit comprising one or more devices having one of a plurality of process corners, the injection circuit configured to generate a third current that is complementary to absolute temperature and having an amplitude that is based on the one of the plurality of process corners.

8. The reference current generator circuit of claim 1, further comprising:
a voltage regulator circuit configured to generate a reference voltage, wherein the first and second currents are generated based on the reference voltage.

9. A method comprising:
receiving an input voltage at a first circuit and a second circuit;
generating a first current proportional to absolute temperature using the first circuit, wherein generating the first current is based on a PN junction diode;
generating a second current complementary to absolute temperature by:
operating a first transistor and a second transistor in a respective triode region, wherein when a respective transistor is operating in a respective triode region its gate to source voltage is greater than its threshold voltage, and its drain to source voltage is less than a difference between its gate to source voltage and its threshold voltage,
connecting a source terminal, a drain terminal, and a gate terminal of a fifth transistor to each other,
connecting a body of the fifth transistor to a node, and operating the fifth transistor as the PN junction diode; and
outputting a reference current based on combining the first and second currents at the node connected to the first and second circuits.

10. The method of claim 9, wherein generating the second current is based on operating a third transistor and a fourth transistor in respective saturation regions, wherein when a respective transistor is operating in a respective saturation region its gate to source voltage is greater than its threshold voltage, and its drain to source voltage is greater than the difference between its gate to source voltage and its threshold voltage.

11. The method of claim 9, further comprising:
removing a degenerate point of a current within a reference voltage generator circuit comprising the first and second circuits by charging the first transistor to a non-zero current.

12. The method of claim 9, wherein outputting the reference current is based on adding the first current to the second current.

13. An integrated circuit comprising:
at least one transistor having a source terminal connected to an input voltage and a body connected to a node, the at least one transistor configured to generate a first current at the node based on the input voltage;
a first plurality of transistors, each sized so that, based on the input voltage, a respective gate to source voltage is greater than a respective threshold voltage based on the input voltage, and a respective drain to source voltage is less than a difference between the respect gate to source voltage and the respective threshold voltage; and
a second plurality of transistors, each sized so that, based on the input voltage, a respective gate to source voltage is greater than a respective threshold voltage based on the input voltage, and a respective drain to source voltage is greater than the difference between the respect gate to source voltage and the respective threshold voltage;
wherein the first and second plurality of transistors are configured to generate a second current at the node that compensates for variations in the first current.

14. The integrated circuit of claim 13, wherein each of the second plurality of transistors has a second polarity that is opposite to a first polarity of each of the first plurality of transistors, and the at least one transistor is of the second polarity.

15. The integrated circuit of claim 13, further comprising:
a third plurality of transistors connected to the first plurality of transistors, the third plurality of transistors configured to generate a third circuit based on a process corner of the third plurality of transistors.

16. The integrated circuit of claim 13, further comprising:
a startup transistor connected to at least one of the first plurality of transistors and configured to remove degenerate points in the integrated circuit.

* * * * *